(12) United States Patent
Maeda et al.

(10) Patent No.: US 7,739,571 B2
(45) Date of Patent: Jun. 15, 2010

(54) SEMICONDUCTOR INTEGRATED CIRCUIT AND SYSTEM LSI HAVING A TEST EXPECTED VALUE PROGRAMMING CIRCUIT

(75) Inventors: Yasuteru Maeda, Kyoto (JP); Toshinori Maeda, Osaka (JP)

(73) Assignee: Panasonic Corporation, Osaka (JP)

( * ) Notice: Subject to any disclaimer, the term of this patent is extended or adjusted under 35 U.S.C. 154(b) by 384 days.

(21) Appl. No.: 11/795,904

(22) PCT Filed: Sep. 27, 2005

(86) PCT No.: PCT/JP2005/017727

§ 371 (c)(1),
(2), (4) Date: Jul. 24, 2007

(87) PCT Pub. No.: WO2006/080111

PCT Pub. Date: Aug. 3, 2006

(65) Prior Publication Data

US 2008/0141089 A1  Jun. 12, 2008

(30) Foreign Application Priority Data

Jan. 27, 2005  (JP) .............................. 2005-019757

(51) Int. Cl.
*G06F 11/27* (2006.01)
*G06F 11/25* (2006.01)
*G06F 11/263* (2006.01)
(52) U.S. Cl. .................... 714/736; 714/733; 714/738
(58) Field of Classification Search ................ 714/724, 714/733, 736, 738
See application file for complete search history.

(56) References Cited

U.S. PATENT DOCUMENTS

| | | | | |
|---|---|---|---|---|
| 5,933,434 A | * | 8/1999 | Roohparvar | ................. 714/718 |
| 6,708,301 B1 | * | 3/2004 | Ohta et al. | .................. 714/724 |
| 7,000,160 B2 | * | 2/2006 | Tanaka et al. | ................ 714/724 |
| 2003/0237036 A1 | * | 12/2003 | Kimura | ...................... 714/733 |

FOREIGN PATENT DOCUMENTS

| | | |
|---|---|---|
| JP | 56-11369 | 2/1981 |
| JP | 5-26979 | 2/1993 |
| JP | 06-043222 | 2/1994 |
| JP | 6-43222 | 2/1994 |
| JP | 6-194423 | 7/1994 |
| JP | 2000-266816 | 9/2000 |
| JP | 2003-114259 | 4/2003 |
| JP | 2004-93421 | 3/2004 |

OTHER PUBLICATIONS

Japanese Office Action, with English translation, issued in Japanese Patent Application No. 2007-500418, mailed Aug. 25, 2009.

* cited by examiner

*Primary Examiner*—James C Kerveros
(74) *Attorney, Agent, or Firm*—McDermott Will & Emery LLP

(57) ABSTRACT

In a semiconductor integrated circuit 11, there is constructed a test expected value programming circuit 100 having an input/input-output pad 103 for retrieving a ground/power-source signal 104 from a ground terminal 30 or a power source terminal 31 connected to the semiconductor integrated circuit 11, a switch 105 for selectively switching the outputting of the ground/power-source signal 104 inputted via the input/input-output pad 103, and an expected value generation circuit 13 for generating a test expected value signal 21 based on a switch output signal 122 outputted from the switch 105.

14 Claims, 20 Drawing Sheets

US 7,739,571 B2

SEMICONDUCTOR INTEGRATED CIRCUIT AND SYSTEM LSI HAVING A TEST EXPECTED VALUE PROGRAMMING CIRCUIT

RELATED APPLICATIONS

This application is the U.S. National Phase under 35 U.S.C. §371 of International Application No. PCT/JP2005/017727, filed on Sep. 27, 2005, which in turn claims the benefit of Japanese Application No. 2005-019757, filed on Jan. 27, 2005, the disclosures of which Applications are incorporated by reference herein.

TECHNICAL FIELD

The present invention relates to a semiconductor integrated circuit and a system LSI in each of which a test can be easily performed.

BACKGROUND ART

A functional test in a semiconductor integrated circuit is typically performed by the following procedure. First, a test input signal is inputted to a semiconductor integrated circuit to be tested and a test output signal outputted in response to the input is received by an LSI testing apparatus. The LSI testing apparatus compares the test output signal outputted from the semiconductor integrated circuit with a test expected value signal indicating an output state during a normal operation and judges the result of the comparison, thereby testing whether or not the semiconductor integrated circuit is normally operating.

To perform a functional test as described above, it is necessary to provide dedicated test terminals capable of directly inputting the test input signal to a circuit under test and directly outputting the test output signal or shared test terminals used also as the external terminals of an LSI (hereinafter referred to as the dedicated/shared test terminals).

However, as semiconductor integrated circuits become larger in scale and more complicated, the number of the dedicated/shared test terminals required to input and output test signals tends to increase. As a conventional method for suppressing such an increase in the number of test terminals, a test method termed BIST (Built in Self Test) has been known (see Patent Document 1). The BIST is a test method which causes the test input signal and the test expected value signal each required to perform the functional test in the LSI testing apparatus to be generated within the circuit under test, causes expected value judging means provided within the circuit to make a comparison and judge the result of the comparison, and causes only the result of the judgment to be outputted from the semiconductor integrated circuit.

This eliminates the need to directly input the test signal to the circuit under test from outside the LSI and directly output the test signal from the circuit under test. As a result, it is possible to suppress the increase in the number of the test terminals by providing only a minimum number of terminals required to implement the BIST as the test terminals.

Patent Document: Japanese Laid-Open Patent Publication No. 2004-93421

DISCLOSURE OF THE INVENTION

Problem to be Solved by the Invention

In the conventional BIST method, a test signal need not be inputted directly from outside an LSI to a circuit under test and, accordingly, the number of test terminals can be reduced considerably. However, as a high-speed interface, a highly accurate analog circuit, and the like have been mounted on a system LSI as a recent trend, they are more susceptible to the influence of noise or load when the external terminals of an LSI are used also as test terminals, which further leads to the problem that the external terminals that can be used as the test terminals are limited. There is also the problem that an area occupied by circuits necessary in using the BIST method, such as an expected value generation circuit and an input value generation circuit, increases as the circuit scale tends to increase.

On the other hand, the development of a technology which packages a plurality of semiconductor integrated circuits as a single system LSI has been pursued in recent years. Examples of such a system-in package (hereinafter referred to as SIP) includes a type composed of a plurality of semiconductor integrated circuits which are provided on a single substrate and a type composed of a plurality of semiconductor integrated circuits which are bonded to each other in multiply stacked relation.

In performing a functional test on such a SIP, when the plurality of semiconductor integrated circuits composing the SIP includes at least one which does not have a self-diagnostic function, the BIST method cannot be used any more. This eventually causes a necessity to provide dedicated/shared test terminals and causes the problem of an increase in the number of test terminals again.

In addition, when a circuit under test is to be functionally tested at the same speed as during the actual operation thereof in view of the recent increase in the speed of an LSI circuit, the problem occurs that it is difficult to implement physical timing design for performing a function test on the entire system LSI including the dedicated/shared test terminals and the circuit under test in actual operation.

When a supply related problem occurs in a semiconductor integrated circuit to be constructed and another semiconductor integrated circuit is used as a substitute, it is necessary to change input values and expected values each for the test. This causes the problem that the test cannot be performed unless a hardware correction of the semiconductor integrated circuit is performed.

In view of the foregoing, it is therefore an object of the present invention to provide a semiconductor integrated circuit capable of solving the problem that, when a functional test is performed on an LSI, the number of dedicated/shared test terminals for inputting a required signal from the outside increases.

Another object of the present invention is to provide a semiconductor integrated circuit for solving the problem of an increased number of test terminals which occurs when a system LSI of a SIP type composed of a plurality of semiconductor integrated circuits includes at least one which does not have a self-diagnostic function.

Means for Solving the Problems

To attain the objects described above, the present invention is a semiconductor integrated circuit having an embedded circuit under test to be tested, the semiconductor integrated circuit comprising: test expected value programming means for generating a test expected value signal for a comparison with a test result in the circuit under test, wherein the test expected value programming means comprises: an input/input-output pad for retrieving a predetermined input signal required for a test from a ground terminal or a power source terminal connected to the semiconductor integrated circuit; a switch connected to the input/input-output pad to selectively switch an output state of the signal inputted via the input/input-output pad; and an expected value generation circuit for generating the test expected value signal based on an output signal outputted from the switch.

Thus, the present invention allows an input signal required during BIST to be inputted from outside an LSI by using a power source terminal or a ground terminal without using dedicated/shared test terminals.

Effect of the Invention

The semiconductor integrated circuit according to the present invention allows a reduction in the number of the dedicated/shared test terminals required during, e.g., BIST in a functional test.

Moreover, since a test can be performed without having some of test expected values and test input values provided within the semiconductor integrated circuit of a conventional BIST circuit, it is possible to suppress an increase in circuit area.

DESCRIPTION OF NUMERALS

Figure 1:
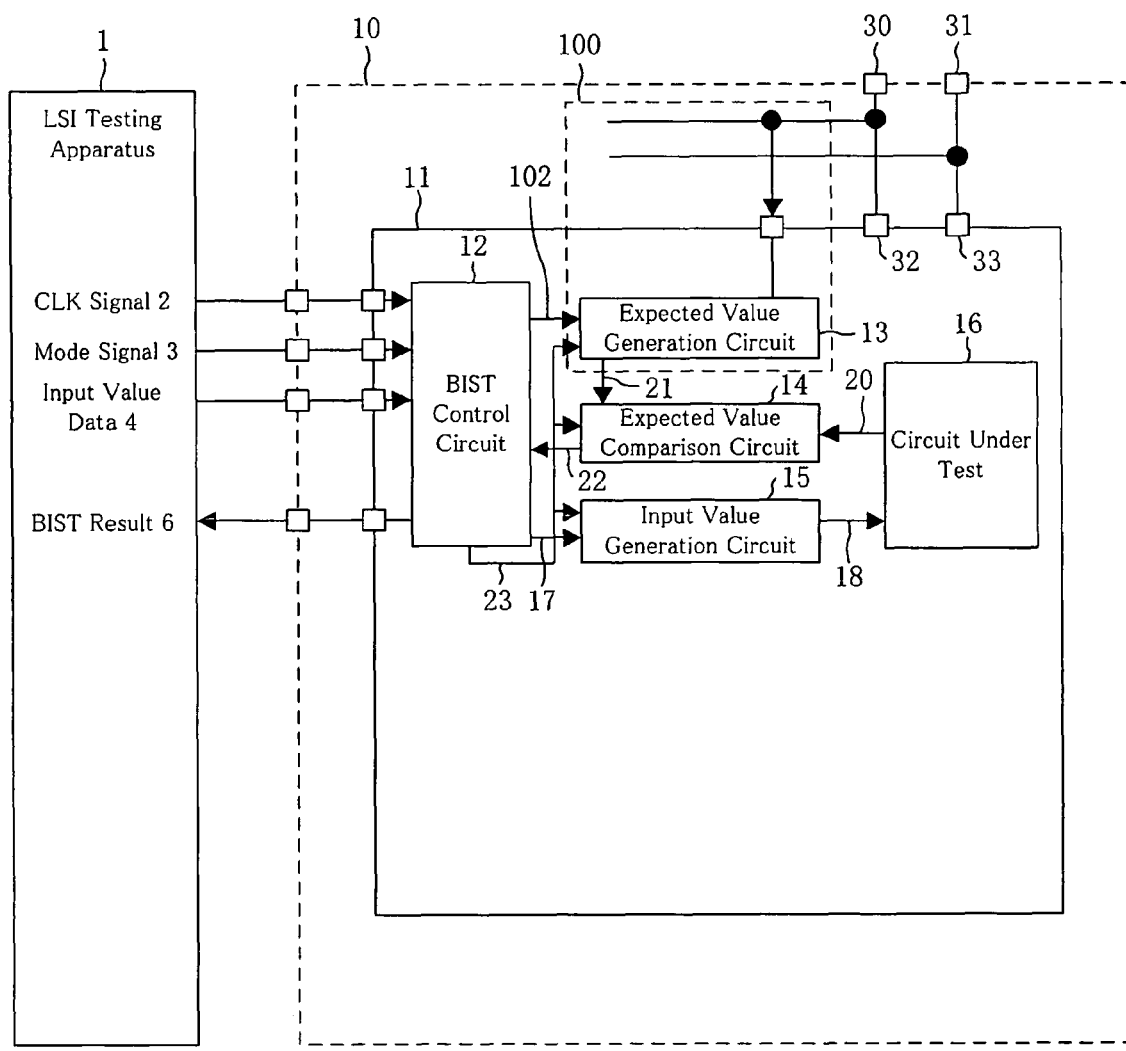
FIG. 1 is a block diagram showing a structure of a semiconductor integrated circuit in Embodiment 1 of the present invention.

10 Semiconductor Integrated Circuit Package
11 Semiconductor Integrated Circuit A
12 BIST Control Circuit
13 Expected Value Generation Circuit
14 Expected Value Comparison Circuit
15 Input Value Generation Circuit
16 Circuit Under Test
30 Ground Terminal
31 Power Source Terminal
43 Ground Land
45 Power Source Land
46 Power Source Layer
47 Ground Layer
48 Bump
50 Wire Line
31 Lead Frame
60 Semiconductor Integrated Circuit B
61 Circuit Under Test
70 Semiconductor Integrated Circuit N
71 Circuit Under Test
82 Selector
83 Internal Circuit
85 Selector N
88 Internal Circuit
100 Test Expected Value Programming Circuit
103 Input/Input-Output Pad
105 Switch
109 Switch Control Circuit 120 Shift Register Circuit
200 Test Input Value Programming Circuit

BEST FOR CARRYING OUT THE INVENTION

Referring to the drawings, the embodiments of the present invention will be described hereinbelow in detail. The description of the following preferred embodiments is substantially only illustrative and is by no means intended to limit the present invention and the application and use thereof.

Embodiment 1

FIG. 1 is a block diagram showing an overall structure of a semiconductor integrated circuit in Embodiment 1 of the present invention. In FIG. 1, 10 denotes a semiconductor integrated circuit package and 11 denotes a semiconductor integrated circuit A packaged in the semiconductor integrated circuit package 10. In the semiconductor integrated circuit A11, there are embedded a BIST control circuit 12 for controlling the generation of a BIST mode, the generation of test input values, the generation of test expected values, and the generation of an internal CLK and a circuit under test 16.

To the BIST control circuit 12, information required to perform a test, i.e., a CLK signal 2, a mode signal 3 for determining a test mode, and input value data 4 required to generate the test input values are inputted from an LSI testing apparatus 1. In the BIST control circuit 12, a CLK signal 23 is generated based on the CLK signal 2, an expected value control signal 102 is generated based on the mode signal 3, and an input value control signal 17 is generated based on the mode signal 3 and the input value data 4.

The CLK signal 23 generated in the BIST control circuit 12 is inputted to each of an expected value comparison circuit 14, an input value generation circuit 15, and an expected value generation circuit 13 within a test expected value programming circuit 100. To the expected value generation circuit 13, the expected value control signal 102 is inputted in synchronization with the CLK signal 23. To the input value generation circuit 15, the input value control signal 17 is inputted in synchronization with the CLK signal 23.

Each of the expected value generation circuit 13, the expected value comparison circuit 14, and the input value generation circuit 15 operates in synchronization with the CLK signal 23 inputted thereto to allow a test in the circuit under test 16 to be performed at a frequency synchronous to the CLK signal 23.

In the input value generation circuit 15, a test input signal 18 is generated based on the input value control signal 17 and inputted to the circuit under test 16. In the circuit under test 16, an output result responding to the test input signal 18 inputted thereto is generated and outputted as a test output signal 20 to the expected value comparison circuit 14.

Figure 2:
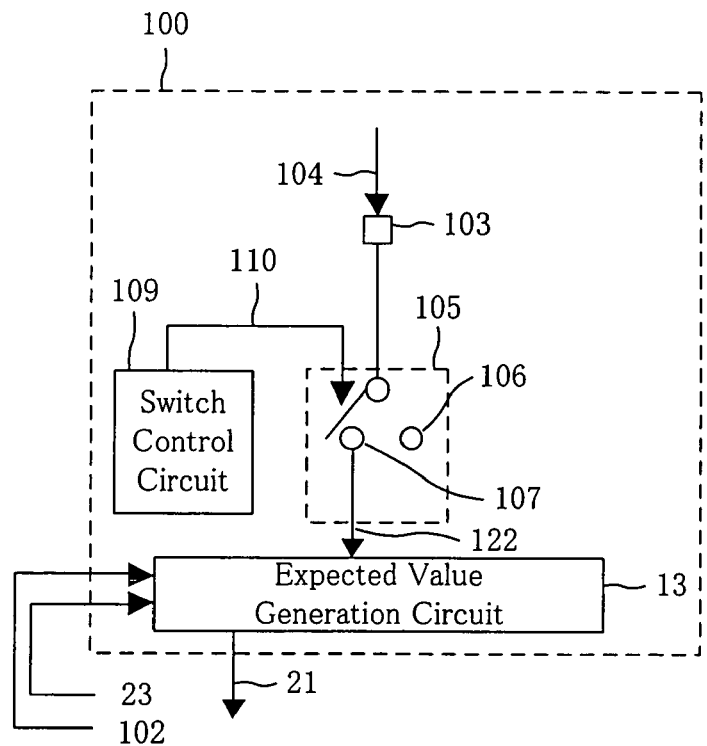
FIG. 2 is a block diagram showing a structure of a test expected value programming circuit in Embodiment 1.

As shown in FIG. 2, the test expected value programming circuit 100 comprises an input/input-output pad 103 for retrieving a signal from the ground terminal 30 or power source terminal 31 of the semiconductor integrated circuit package 10, a switch 105 for selectively switching the outputting of the signal inputted via the input/input-output pad 103, a switch control circuit 109 for outputting a switch control signal 110 for controlling the switch 105, and the expected value generation circuit 13.

To the switch 105, a ground/power-source signal 104 is inputted from the ground terminal 30 or the power source terminal 31 via the input/input-output pad 103. To the switch 105, the switch control signal 110 outputted from the switch control circuit 109 is further inputted so that the connection state of the switch 105 is switched based on the switch control signal 110. Specifically, the connection state of the switch 105 is switched such that, during an other-than-test-mode time 106, the switch 105 and the expected value generation circuit 13 are brought into an unconnected state and, during a test-mode time 107, an input to the switch 105 is inputted as it is as a switch output signal 122 to the expected value generation circuit 13. In the expected value generation circuit 13, a test expected value signal 21 is generated and outputted to the expected value comparison circuit 14.

In the expected value comparison circuit 14, a comparison is made between the test output signal 20 and the test expected value signal 21 and a comparison result signal 22 indicating the result of the comparison between the two signals is outputted to the BIST control circuit 12. From the BIST control circuit 12, a BIST result 6 indicating whether or not a product judged based on the comparison result signal 22 is acceptable is outputted to the LSI testing apparatus 1.

Thus, with the semiconductor integrated circuit according to Embodiment 1, it is possible to retrieve a signal required for a BIST test directly from the ground terminal or the power source terminal without passing the signal through the external terminals of an LSI and reduce the number of dedicated/shared test terminals provided outside the LSI.

In addition, because the testing of the circuit under test 16 can be performed in synchronization with the CLK signal 23, a test at the speed of an actual operation is enabled by setting the frequency of the CLK signal 23 to the frequency at which the circuit under test 16 actually operates.

Embodiment 2

Figure 3:
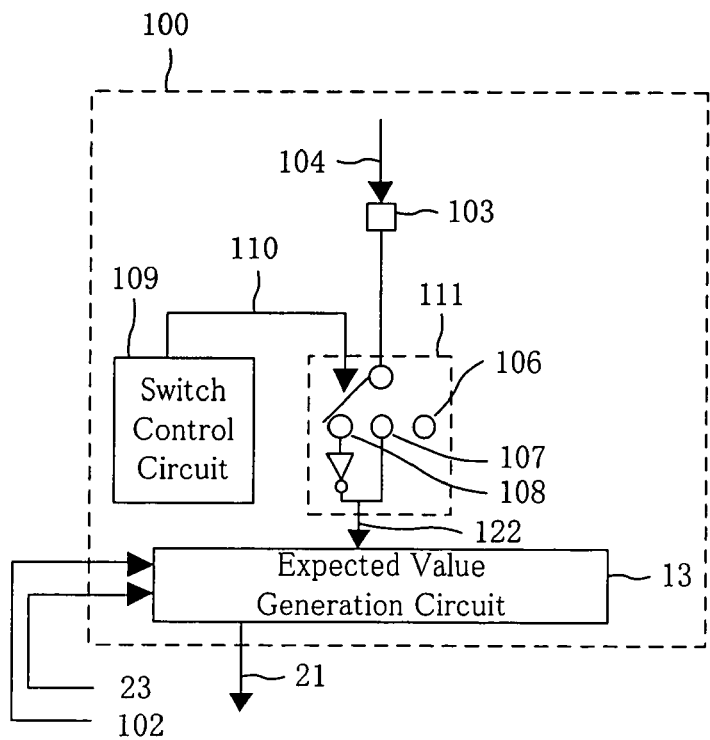
FIG. 3 is a block diagram showing a structure of a test expected value programming circuit in Embodiment 2 of the present invention.

FIG. 3 is a block diagram showing a structure of a test expected value programming circuit according to Embodiment 2 of the present invention. Embodiment 2 is different from Embodiment 1 described above only in the circuit structure of the test expected value programming circuit 100. Accordingly, a description will be given only to the difference by using the same reference numerals for the same components as in Embodiment 1.

As shown in FIG. 3, a switch 111 in the test expected value programming circuit 100 is constructed to allow a selection among the other-than-test-mode time 106, the first test-mode time 107, and a second test-mode time 108.

When the other-than-test-mode time 106 is selected in the switch 111, connection within the switch 111 is disrupted to prevent the ground/power-source signal 104 retrieved from the input/input-output pad 103 from being outputted to the expected value generation circuit 13.

When the first test-mode time 107 is selected in the switch 111, an input to the switch 111 is outputted as it is to the expected value generation circuit 13.

When the second test mode 108 is selected in the switch 111, the input to the switch 111 is inverted and then outputted to the expected value generation circuit 13. The subsequent operation is the same as in Embodiment 1.

Thus, with the semiconductor integrated circuit according to Embodiment 2, it is possible to retrieve a HIGH-level or LOW-level signal required for a BIST test directly from the ground terminal or the power source terminal in synchronization with the CLK signal without passing the signal through the external terminals of an LSI and reduce the number of the dedicated/shared test terminals provided outside the LSI.

Embodiment 3

Figure 4:
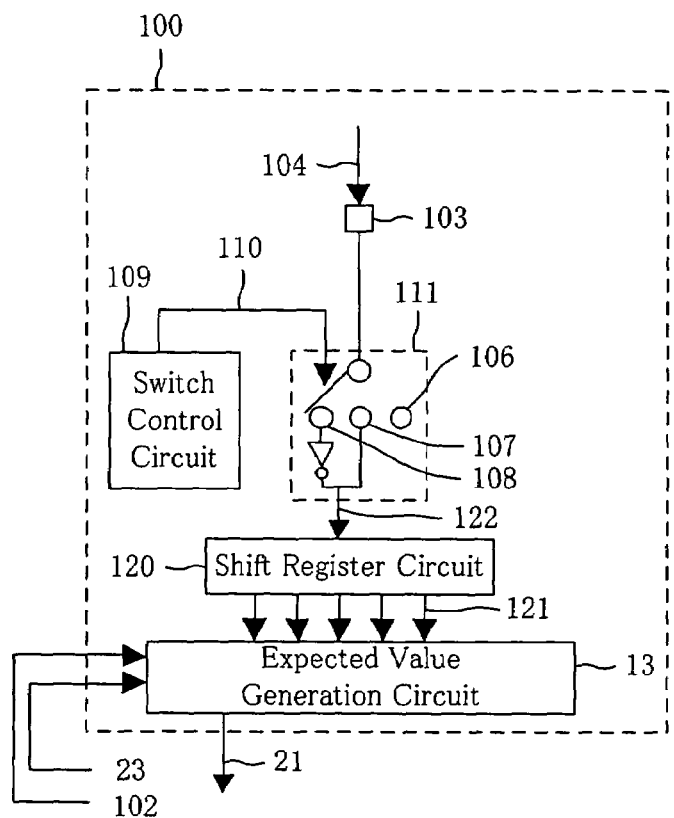
FIG. 4 is a block diagram showing a structure of a test expected value programming circuit in Embodiment 3 of the present invention.

FIG. 4 is a block diagram showing a structure of a test expected value programming circuit according to Embodiment 3 of the present invention. Embodiment 3 is different from Embodiment 2 described above only in that a shift register circuit 120 is provided between the switch 111 and the expected value generation circuit 13. Accordingly, a description will be given only to the difference by using the same reference numerals for the same components as in Embodiment 2.

As shown in FIG. 4, the test expected value programming circuit 100 comprises the shift register circuit 120 for dividing the switch output signal 122 outputted from the switch 111 into a plurality of signals.

Figure 5:
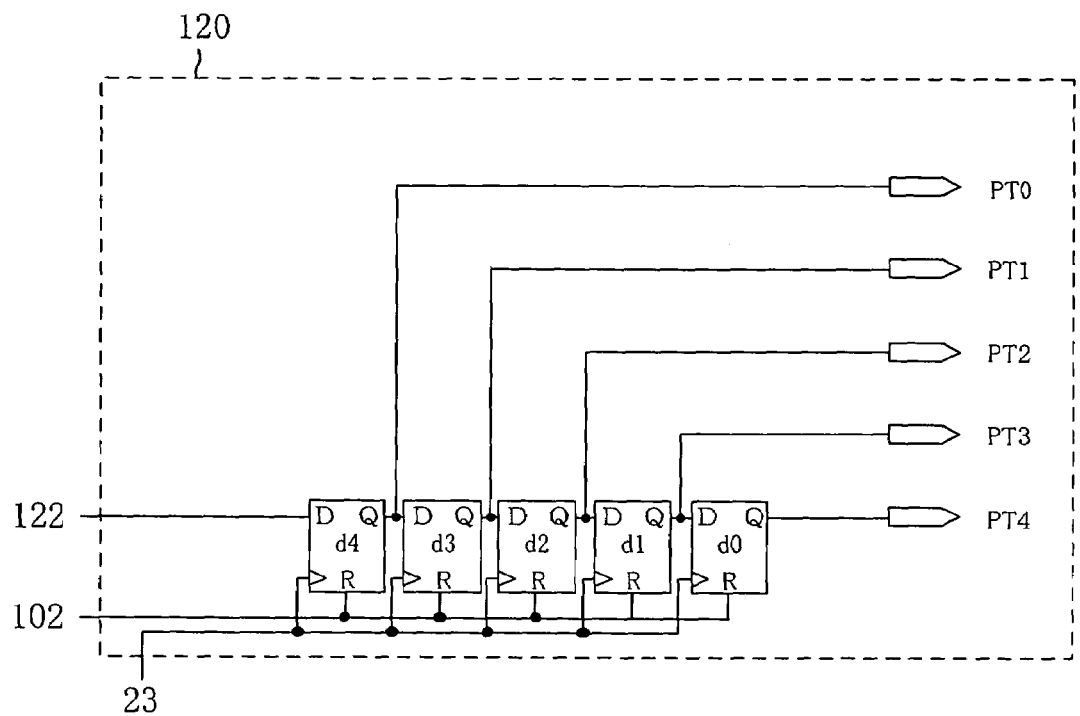
FIG. 5 is a block diagram showing a structure of a shift register circuit in Embodiment 3.
Figure 6:
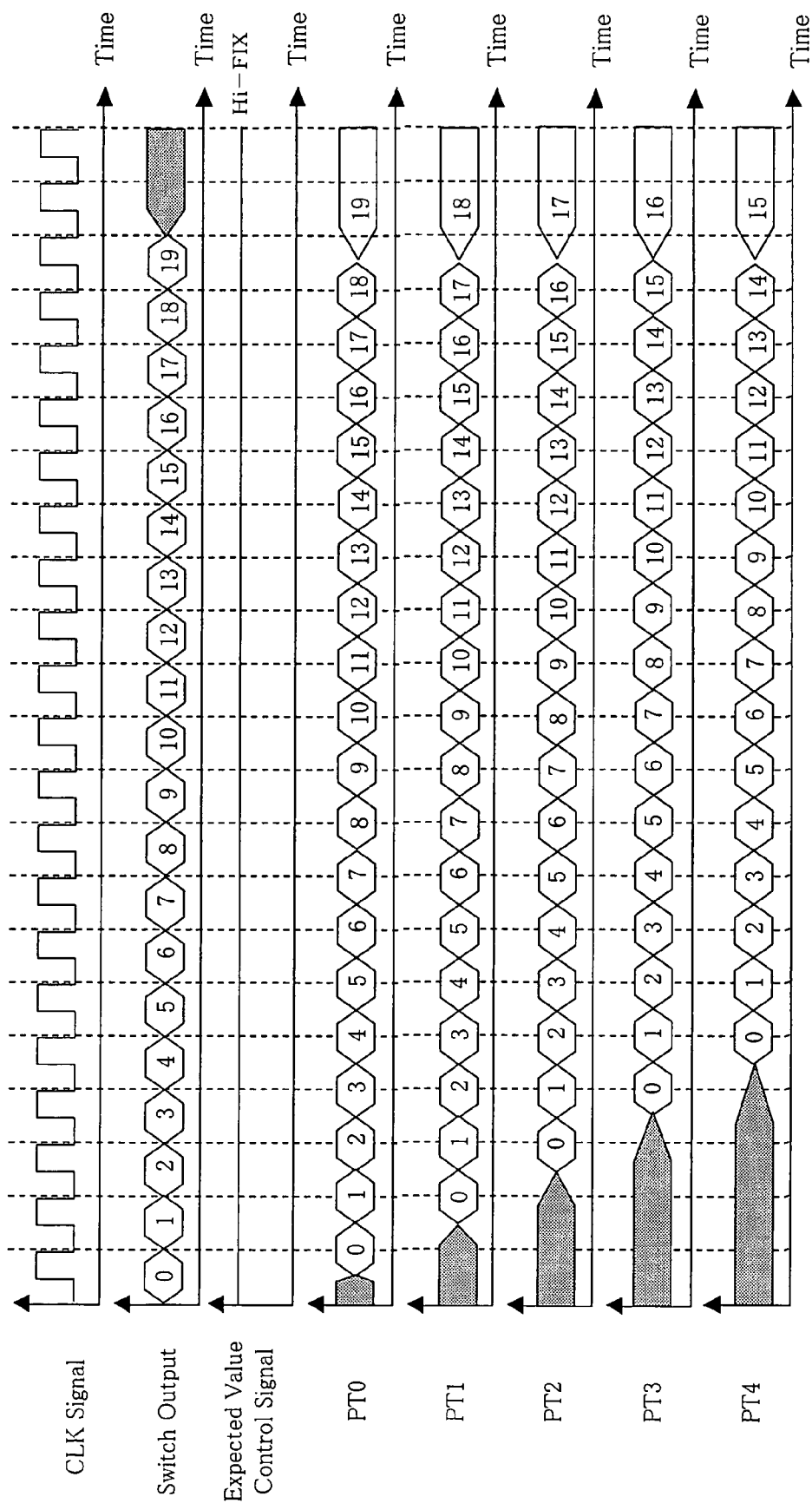
FIG. 6 is a timing chart diagram showing an operation of the shift register circuit in Embodiment 3.

FIG. 5 is a block diagram showing a structure of the shift register circuit 120. To the shift register circuit 120, the switch output signal 122 outputted from the switch 111 is inputted and the expected value control signal 102 and the CLK signal 23 each outputted from the BIST control circuit 12 are inputted in synchronization. As shown in the timing chart diagram of FIG. 6, by generating the plurality of output signals from the single input signal, the switch output signal 122 is divided into a plurality of shift register output signals 121, which are inputted to the expected value generation circuit 13. The subsequent operation is the same as in Embodiment 2.

Thus, with the semiconductor integrated circuit according to Embodiment 3, it is possible to retrieve a HIGH-level or LOW-level signal required for a BIST test directly from the ground terminal or the power source terminal in synchronization with the CLK signal without passing the signal through the external terminals of an LSI and reduce the number of the dedicated/shared test terminals provided outside the LSI.

In addition, since the semiconductor integrated circuit according to Embodiment 3 allows the generation of the test expected values, a test can be performed without having some of the test expected values in an internal circuit so that the effect of reducing a circuit area is obtained.

Embodiment 4

Figure 7:
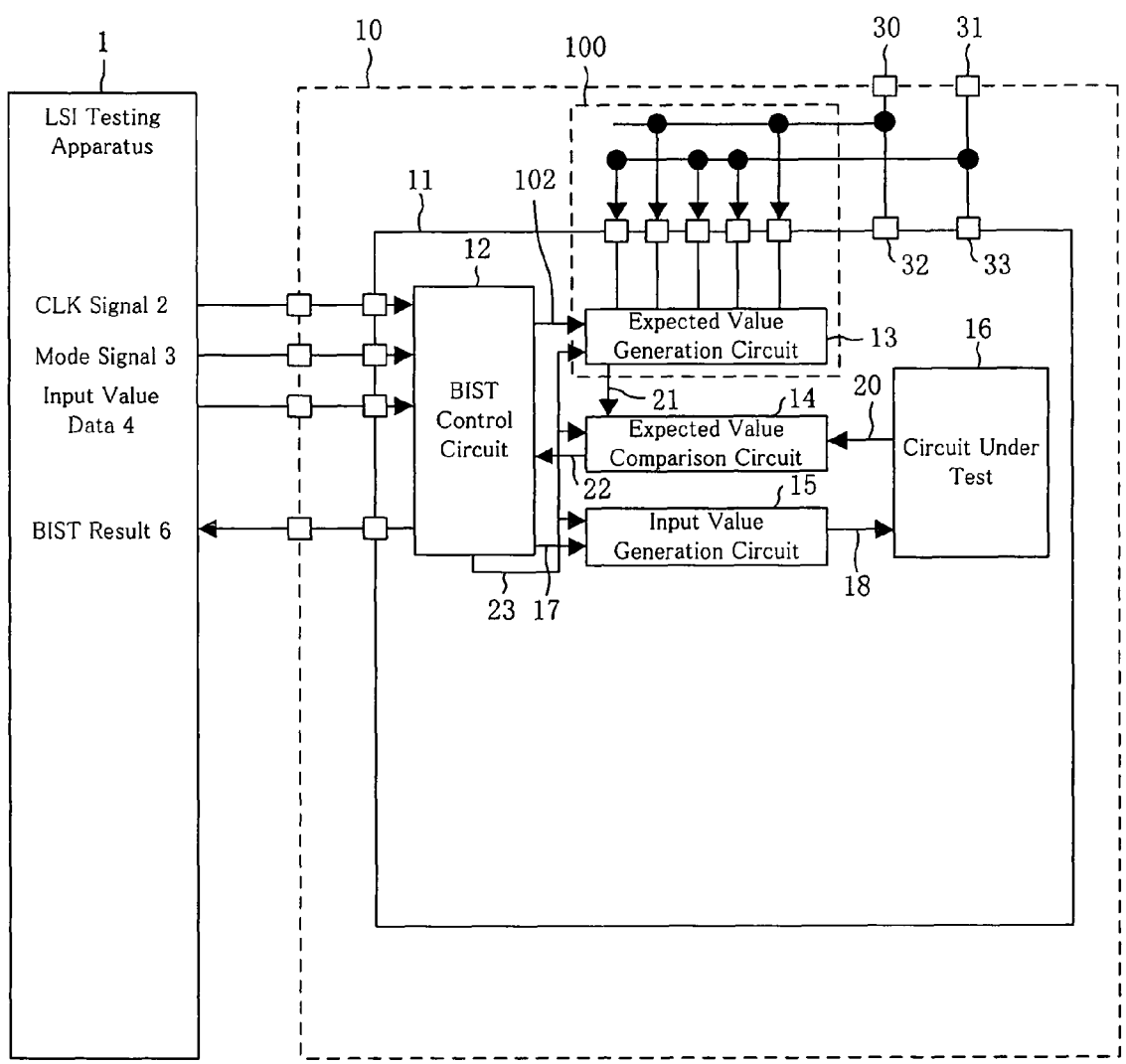
FIG. 7 is a block diagram showing a structure of a semiconductor integrated circuit in Embodiment 4 of the present invention.
Figure 8:
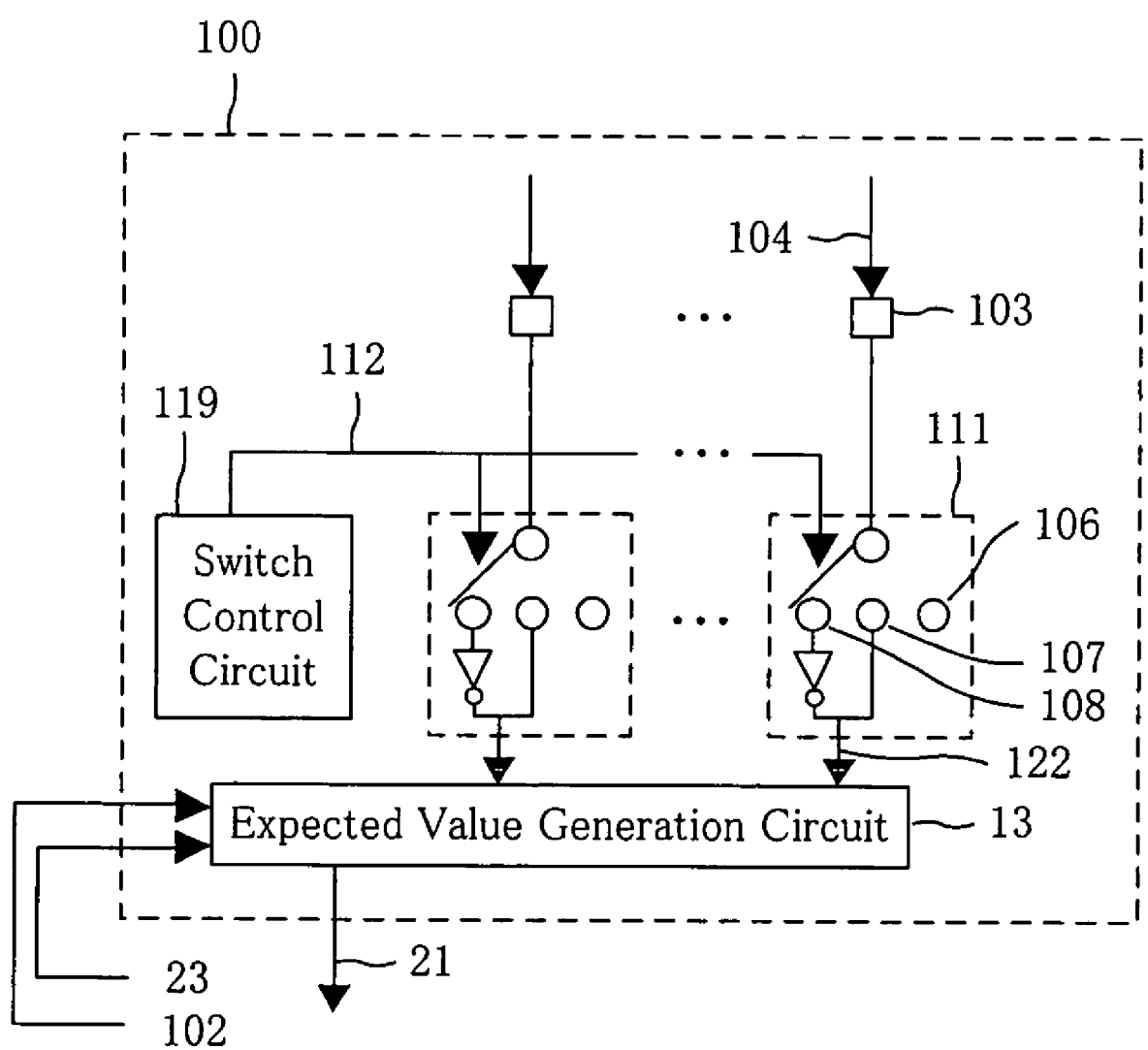
FIG. 8 is a block diagram showing a structure of a test expected value programming circuit in Embodiment 4.

FIG. 7 is a block diagram showing a structure of a semiconductor integrated circuit according to Embodiment 4 of the present invention. FIG. 8 is a block diagram showing a structure of a test expected value programming circuit in Embodiment 4. Embodiment 4 is different from Embodiment 2 described above only in that a plurality of the input/input-output pads for retrieving the ground/power-source signals are provided. Accordingly, a description will be given only to the difference by using the same reference numerals for the same components as in Embodiment 2.

As shown in FIG. 8, the test expected value programming circuit 100 comprises a plurality of the input/input-output pads 103, a plurality of the switches 111 for switching the outputting of the signals inputted from the plurality of input/input-output pads 103, a switch control circuit 119 for collectively controlling the switches 111, and the expected value generation circuit 13.

To the plurality of switches 111, the respective ground/power-source signals 104 are inputted from the ground terminal 30 or the power source terminal 31 via the plurality of input/input-output pads 103. To the plurality of switches 111, respective switch control signals 112 outputted from the switch control circuit 119 are further inputted such that the respective connection states of the switches 111 are controlled simultaneously and collectively based on the switch control signals 112.

Then, respective switch output signals 122 outputted from the plurality of switches 111 are inputted to the expected value generation circuit 13. The subsequent operation is the same as in Embodiment 2 described above.

Thus, with the semiconductor integrated circuit according to Embodiment 4, it is possible to retrieve a plurality of HIGH-level or LOW-level signals required for a BIST test directly from the ground terminal or the power source terminal in synchronization with the CLK signal without passing the signals through the external terminals of an LSI and reduce the number of the dedicated/shared test terminals provided outside the LSI.

Figure 9:
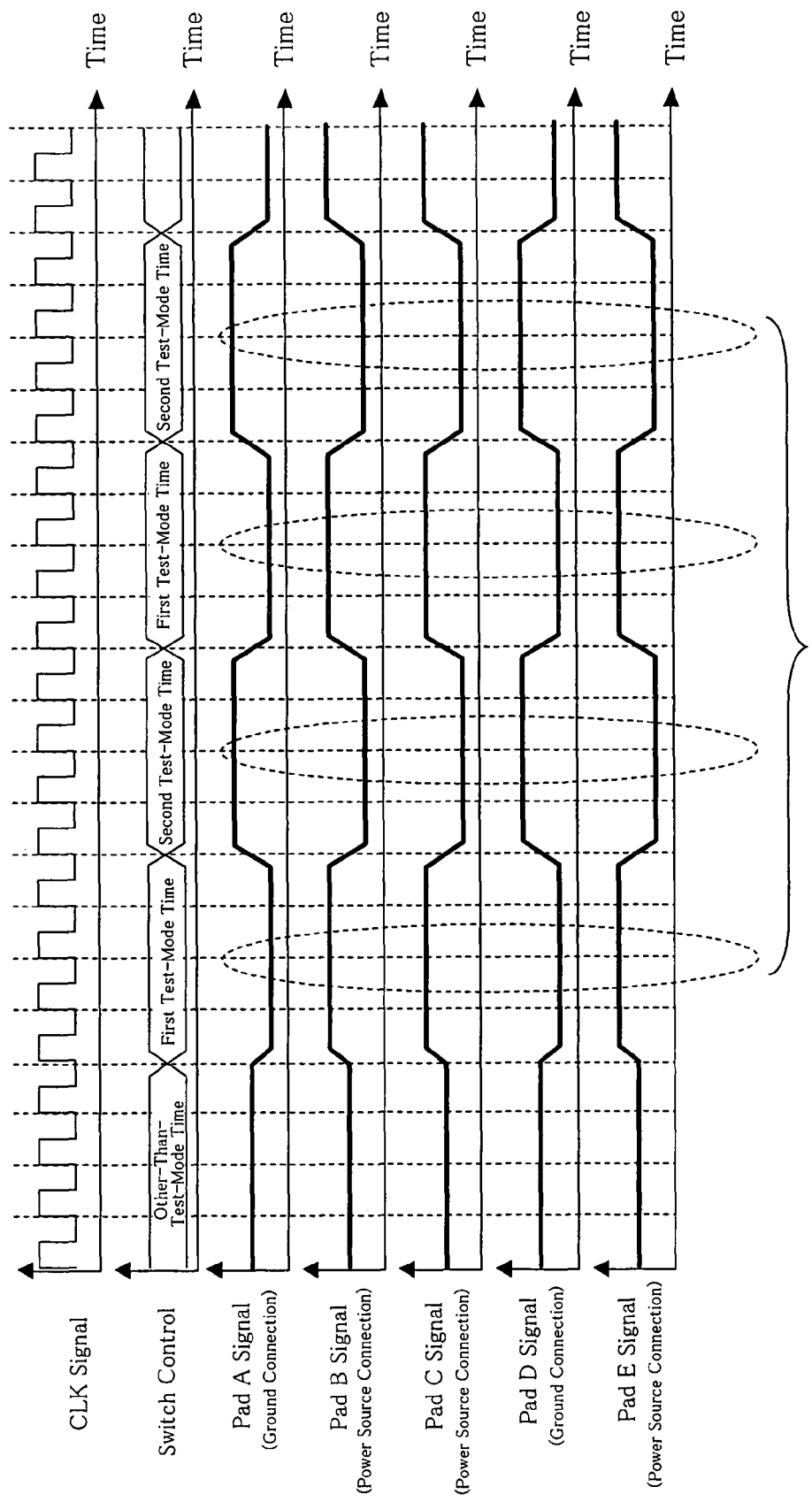
FIG. 9 is a timing chart diagram showing an operation of the semiconductor integrated circuit in Embodiment 4.

In addition, since the semiconductor integrated circuit according to Embodiment 4 allows the generation of complicated test expected values as shown in the timing chart diagram of FIG. 9, a test can be performed without having some of the test expected values in an internal circuit so that the effect of reducing a circuit area is obtained.

Embodiment 5

Figure 10:
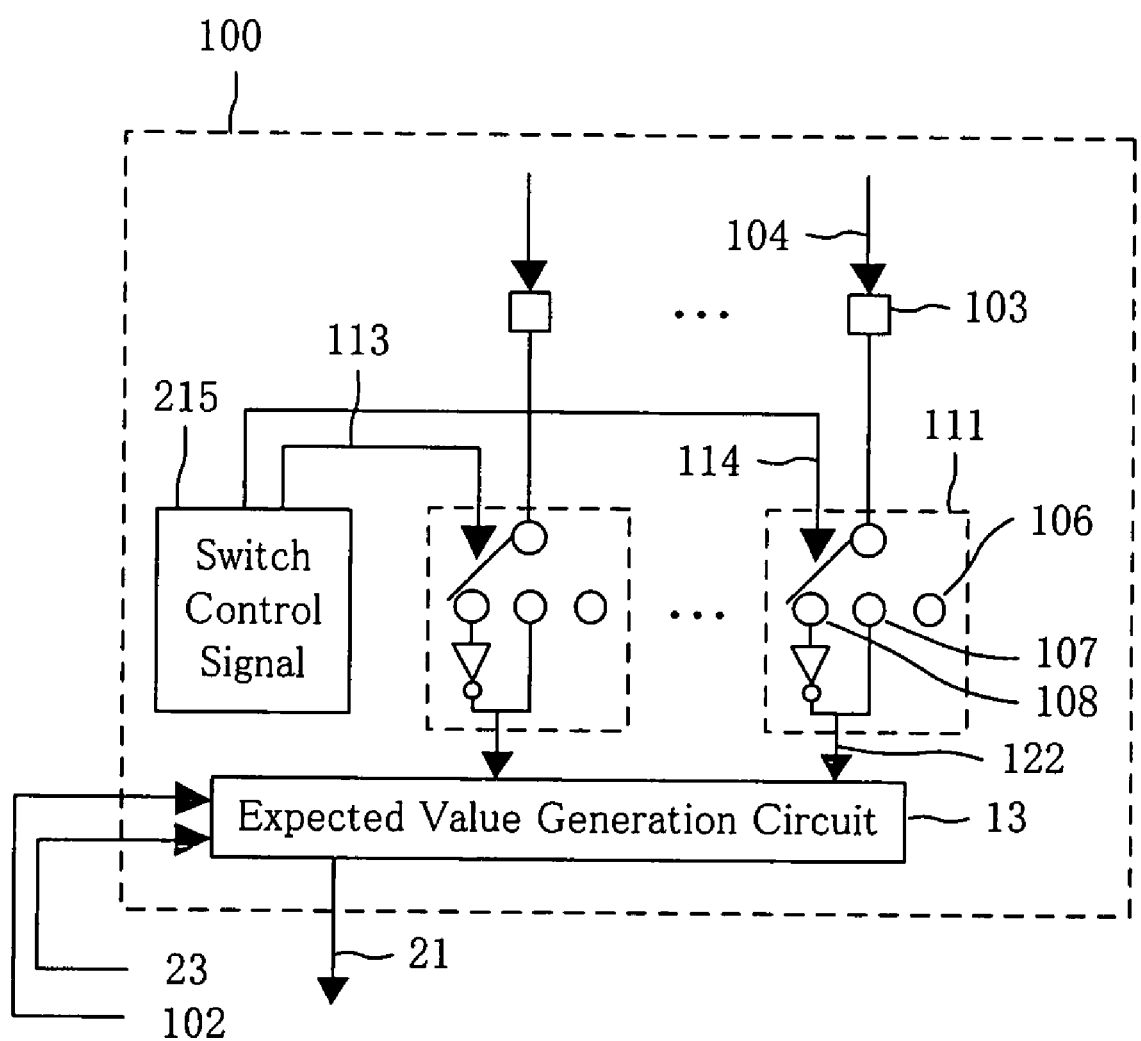
FIG. 10 is a block diagram showing a structure of a test expected value programming circuit in Embodiment 5 of the present invention.

FIG. 10 is a block diagram showing a structure of a test expected value programming circuit in a semiconductor integrated circuit according to Embodiment 5 of the present invention. Embodiment 5 is different from Embodiment 4 described above only in the circuit structure of the test expected value programming circuit 100. Accordingly, a description will be given only to the difference by using the same reference numerals for the same components as in Embodiment 4.

As shown in FIG. 10, the test expected value programming circuit 100 comprises a switch control circuit 215 for individually controlling the plurality of switches 111 and is otherwise the same as in Embodiment 4.

To the plurality of switches 111, the respective ground/power-source signals 104 are inputted from the ground terminal 30 or the power source terminal 31 via the plurality of input/input-output pads 103. To the plurality of switches 111, switch control signals 113 and 114 outputted from the switch control circuit 215 are further inputted so that the respective connection states of the plurality of switches 111 are individually controlled based on the switch control signals 113 and 114.

Then, the respective switch output signals 122 outputted from the plurality of switches 111 are inputted to the expected value generation circuit 13. The subsequent operation is the same as in Embodiment 4.

Thus, with the semiconductor integrated circuit according to Embodiment 5, it is possible to retrieve a plurality of HIGH-level or LOW-level signals required for a BIST test directly from the ground terminal or the power source terminal in synchronization with the CLK signal without passing the signals through the external terminals of an LSI and reduce the number of the dedicated/shared test terminals provided outside the LSI.

Figure 11:
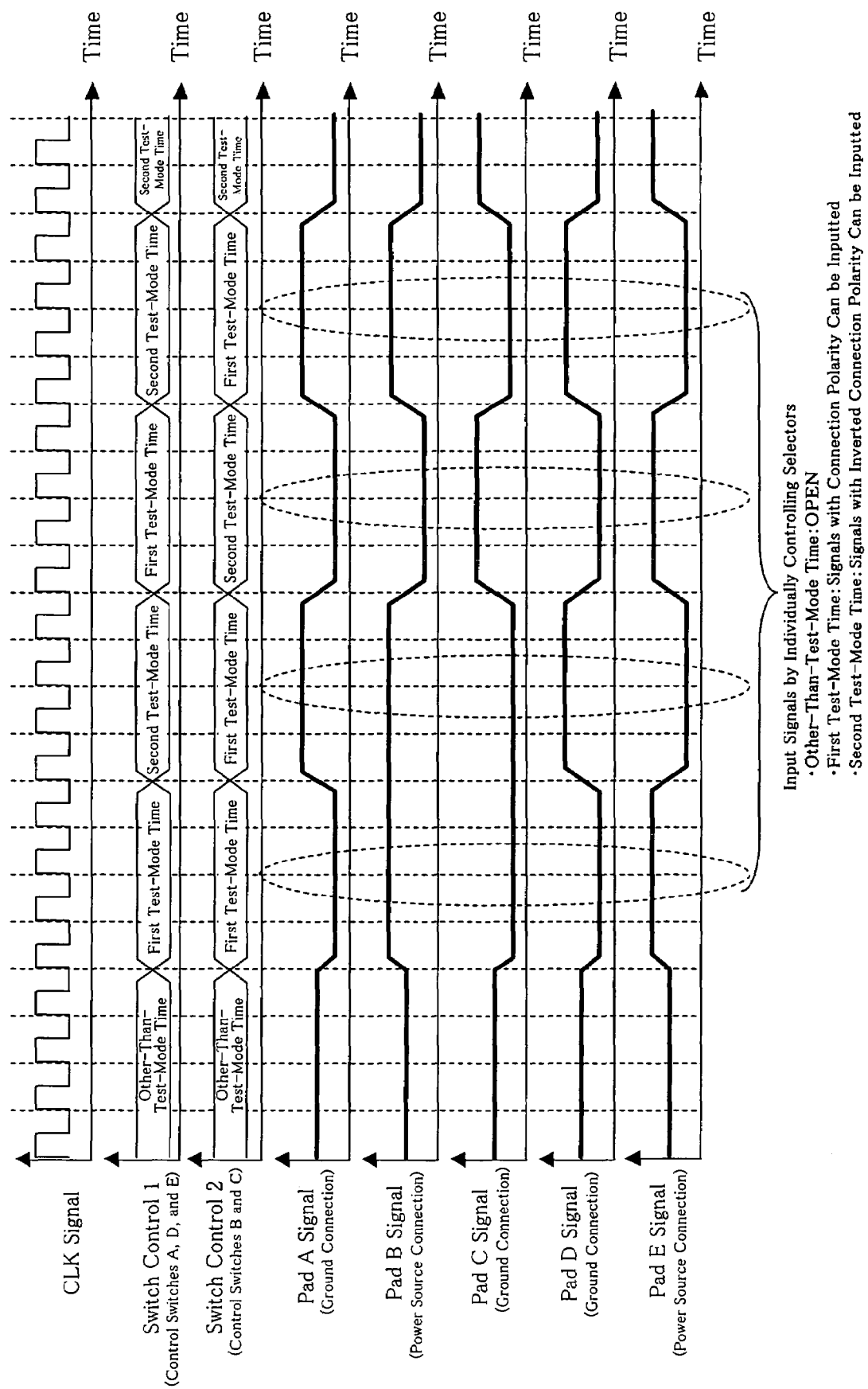
FIG. 11 is a timing chart diagram showing an operation of a semiconductor integrated circuit in Embodiment 5.

In addition, because the semiconductor integrated circuit according to Embodiment 5 allows the generation of complicated test expected values as shown in the timing chart diagram of FIG. 11, a test can be performed without having some of the test expected values in an internal circuit so that the effect of reducing a circuit area is obtained.

Embodiment 6

Figure 12:
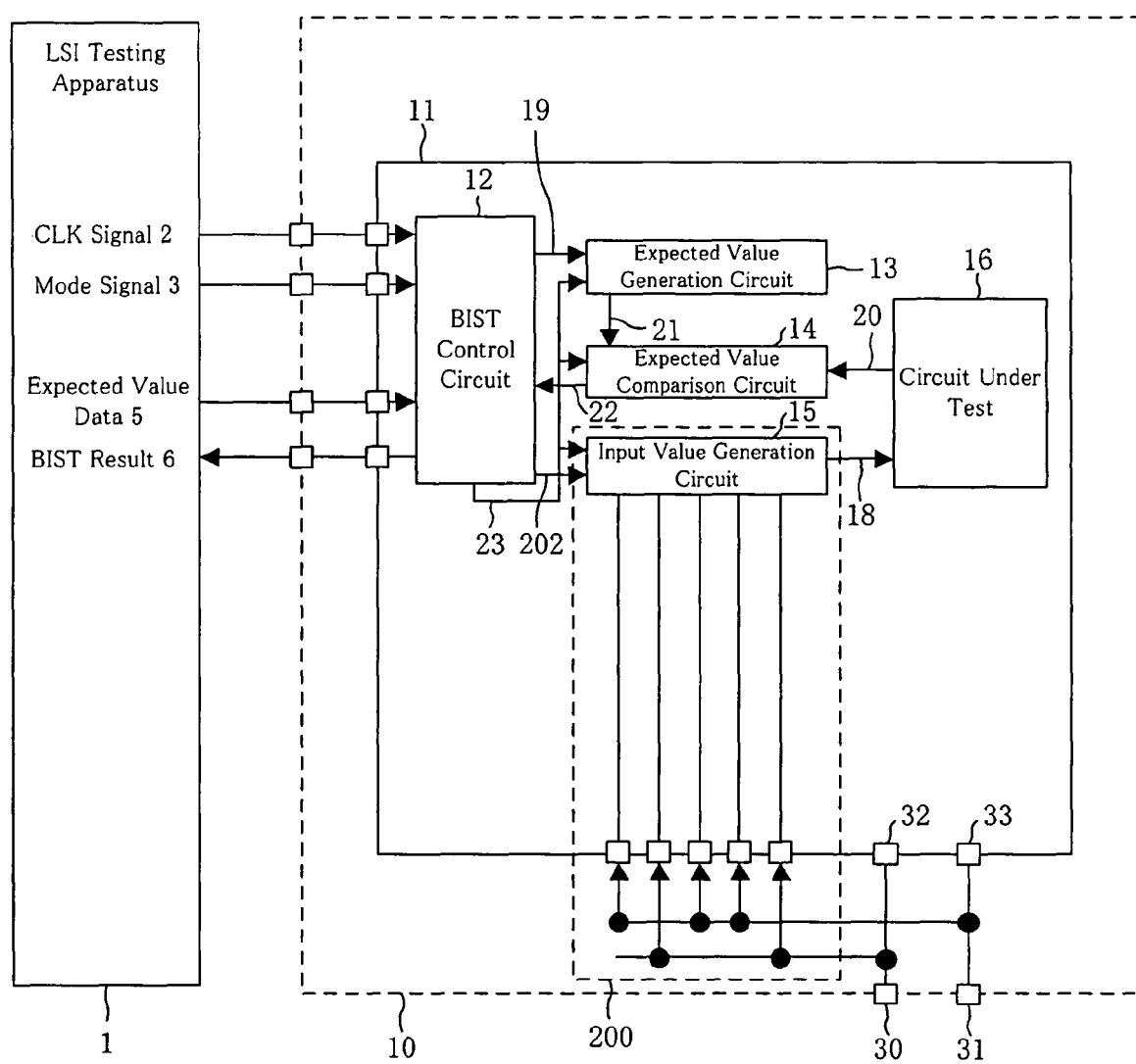
FIG. 12 is a block diagram showing a structure of a semiconductor integrated circuit in Embodiment 6 of the present invention.

FIG. 12 is a block diagram showing a structure of a semiconductor integrated circuit in Embodiment 6 of the present invention. Embodiment 6 is different from Embodiment 5 described above in that a test input value programming circuit is provided in place of the test expected value programming circuit. Accordingly, a description will be given only to the difference by using the same reference numerals for the same components as in Embodiment 5.

As shown in FIG. 12, to the BIST control circuit 12, information required for performing a test, i.e., the CLK signal 2, the mode signal 3 for determining a test mode, and expected value data 5 required for generating the test expected values are inputted from the LSI testing apparatus 1. In the BIST control circuit 12, the CLK signal 23 is generated based on the CLK signal 2, an input value control signal 202 is generated based on the mode signal 3, and an expected value control signal 19 is generated based on the mode signal 3 and the expected value data 5.

Then, the CLK signal 23 generated in the BIST control circuit 12 is inputted to each of the expected value generation circuit 13, the expected value comparison circuit 14, and the input value generation circuit 15 within a test input value programming circuit 200. To the expected value generation circuit 13, the expected value control signal 19 is further inputted in synchronization with the CLK signal 23. To the input value generation circuit 15, the input value control signal 202 is inputted in synchronization with the CLK signal 23.

In the expected value generation circuit 13, the test expected value signal 21 is generated based on the expected value control signal 19 and outputted to the expected value comparison circuit 14.

Figure 13:
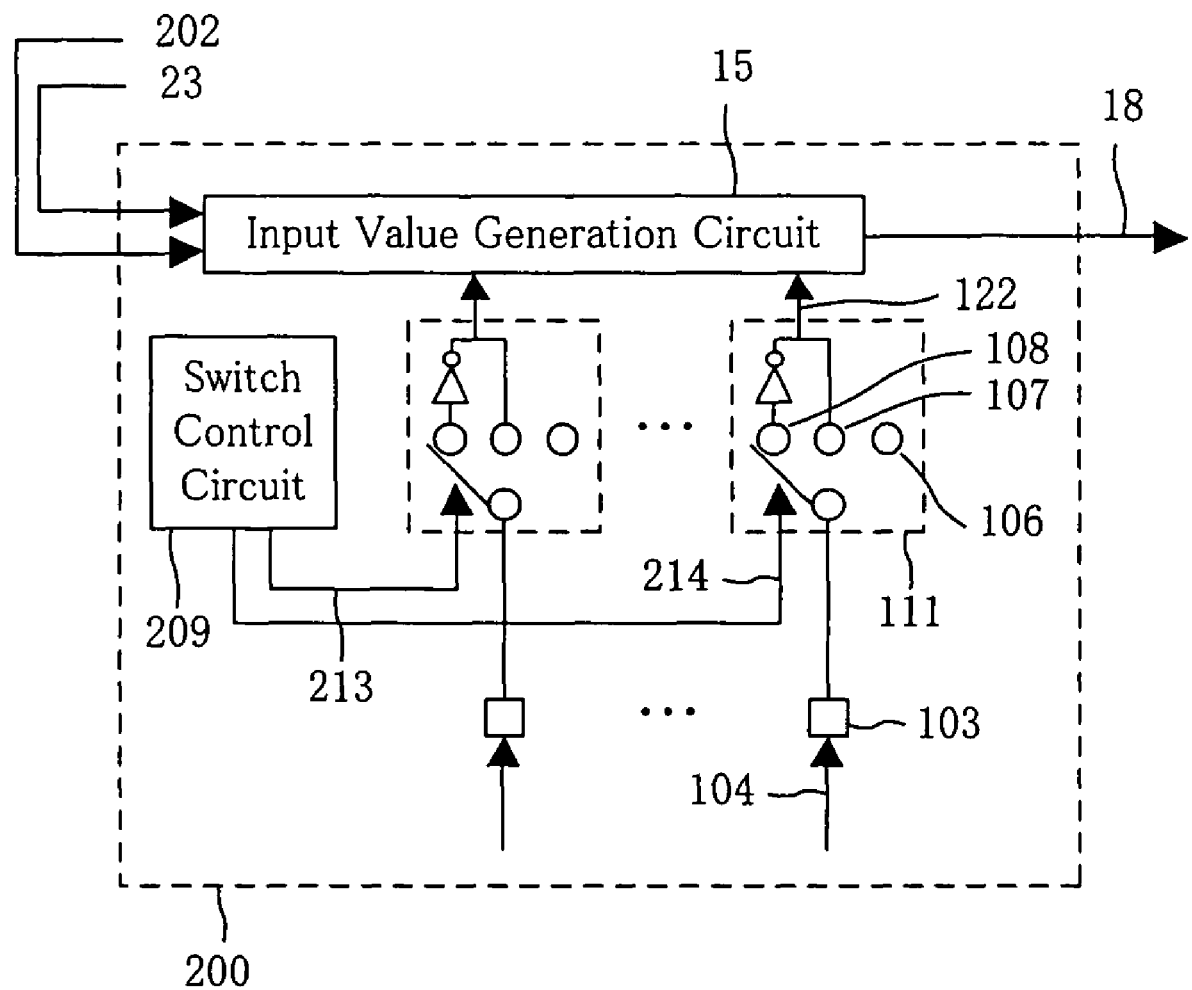
FIG. 13 is a block diagram showing a structure of a test expected value programming circuit in Embodiment 6.

As shown in FIG. 13, the test input value programming circuit 200 comprises the plurality of input/input-output pads 103 for retrieving signals from the ground terminal 30 or power source terminal 31 of the semiconductor integrated circuit package 10, the plurality of switches 111 for switching the outputting of the signals inputted from the plurality of input/input-output pads 103, a switch control circuit 209 for individually controlling the switches 111, and the input value generation circuit 15.

To the plurality of switches 111, the respective ground/power-source signals 104 are inputted from the ground terminal 30 or the power source terminal 31 via the plurality of input/input-output pads 103. To the plurality of switches 111, switch control signals 213 and 214 outputted from the switch control circuit 215 are further inputted so that the respective connection states of the plurality of switches 111 are individually controlled based on the switch control signals 213 and 214.

Specifically, when the other-than-test-mode time 106 is selected in one of the switches 111, connection within the switch 111 is disrupted to prevent the ground/power-source signal 104 retrieved from the input/input-output pad 103 from being outputted to the input value generation circuit 15.

When the first test-mode time 107 is selected in the switch 111, the input to the switch 111 is outputted as it is to the input value generation circuit 15.

When the second test-mode time 108 is selected in the switch 111, the input to the switch 111 is inverted and then outputted to the input value generation circuit 15.

In the input value generation circuit 15, the test input signal 18 is generated based on the inputted signal and outputted to the circuit under test 16. In the circuit under test 16, an output result responding to the test input signal 18 inputted thereto is generated and outputted as the test output signal 20 to the expected value comparison circuit 14.

In the expected value comparison circuit 14, a comparison is made between the test output signal 20 and the test expected value signal 21 and the comparison result signal 22 indicating the result of the comparison between the two signals is outputted to the BIST control circuit 12. From the BIST control circuit 12, the BIST result 6 indicating whether or not a product judged based on the comparison result signal 22 is acceptable is outputted.

Thus, with the semiconductor integrated circuit according to Embodiment 6, it is possible to retrieve a plurality of HIGH-level or LOW-level signals required for a BIST test individually and directly from the ground terminal or the power source terminal in synchronization with the CLK signal without passing the signals through the external terminals of an LSI and reduce the number of the dedicated/shared test terminals provided outside the LSI.

In addition, because the semiconductor integrated circuit according to Embodiment 6 allows the generation of the complicated test expected values in the same manner as in the semiconductor integrated circuit according to Embodiment 5, a test can be performed without having some of the test input values in an internal circuit so that the effect of reducing a circuit area is obtained.

In Embodiment 6, components having the same structures as those of the test expected value programming circuit according to Embodiment 5 described above are used to compose the portion for retrieving the input values from the ground terminal and the power source terminal. However, the present invention is not particularly limited to the embodiment. Instead, it is also possible to use components having the same structures as those of the test expected value programming circuits according to Embodiments 1 to 4 described above.

Embodiment 7

Figure 14:
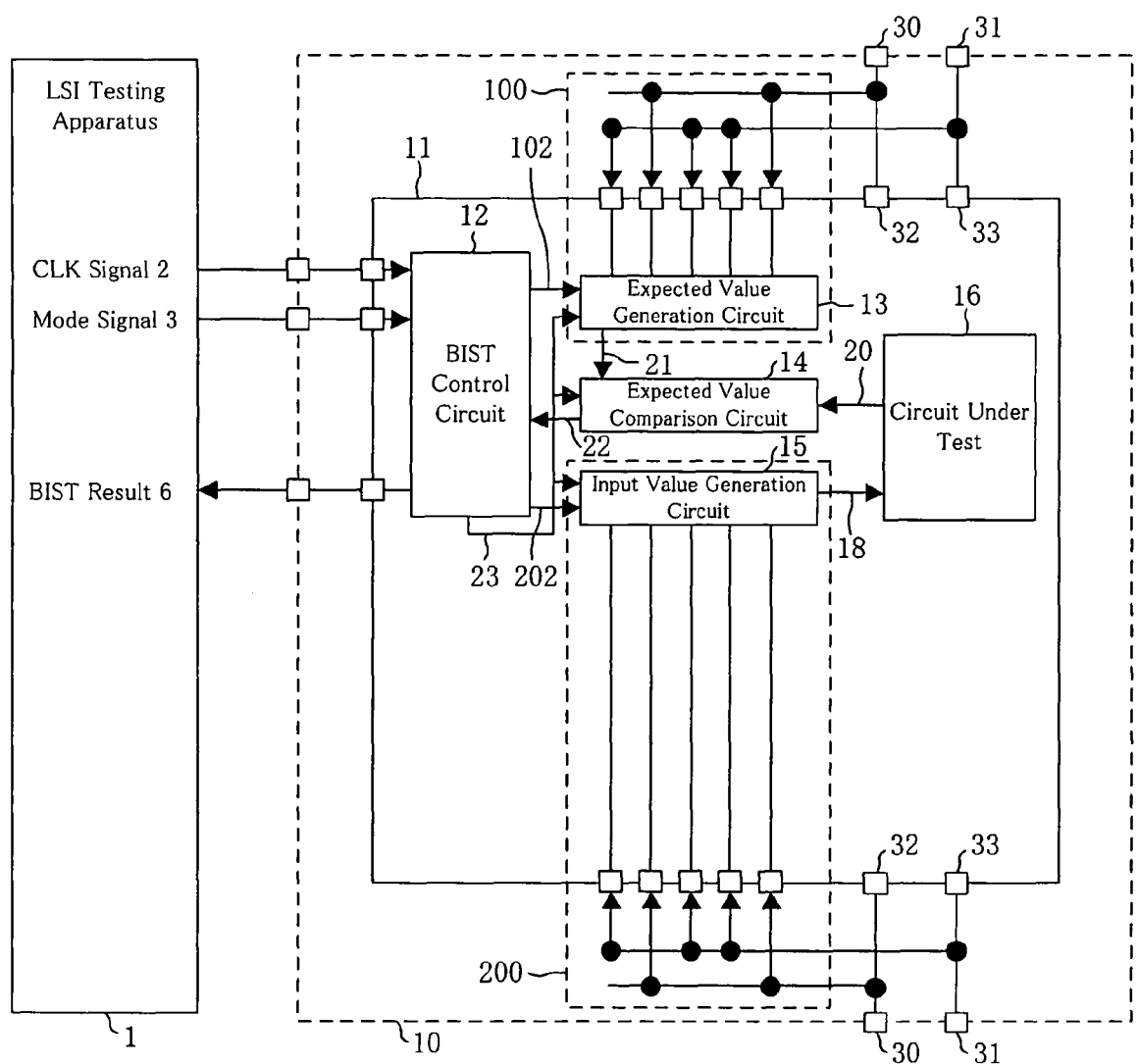
FIG. 14 is a block diagram showing a structure of a semiconductor integrated circuit in Embodiment 7 of the present invention.

FIG. 14 is a block diagram showing a structure of a semiconductor integrated circuit according to Embodiment 7 of the present invention. Embodiment 7 is different from Embodiment 6 described above in that a test expected value programming circuit is provided in conjunction with the test input value programming circuit. Accordingly, a description will be given only to the difference by using the same reference numerals for the same components as in Embodiment 6.

As shown in FIG. 14, to the BIST control circuit 12, information required for performing a test, i.e., the CLK signal 2 and the mode signal 3 for determining a test mode are inputted from the LSI testing apparatus 1. In the BIST control circuit 12, the CLK signal 23 is generated based on the CLK signal 2 and the expected value control signal 102 and the input value control signal 202 are generated based on the mode signal 3.

The CLK signal 23 generated in the BIST control circuit 12 is inputted to each of the expected value comparison circuit 14, the expected value generation circuit 13 within the test expected value programming circuit 100, and the input value generation circuit 15 within the test input value programming circuit 200. To the expected value generation circuit 13, the expected value control signal 102 is inputted in synchronization with the CLK signal 23. To the input value generation circuit 15, the input value control signal 202 is inputted in synchronization with the CLK signal 23.

In the test expected value programming circuit 100, the test expected value signal 21 is generated based on the expected value control signal 102 and outputted to the expected value comparison circuit 14. The operation at this time is the same as in Embodiment 5 described above so that the detailed description thereof is omitted.

In the test input value programming circuit 200, the test input signal 18 is generated based on the input value control signal 202 and outputted to the circuit under test 14. The operation at this time is the same as in Embodiment 6 described above so that the detailed description thereof is omitted.

In the circuit under test 16, an output result responding to the test input signal 18 inputted thereto is generated and outputted as the test output signal 20 to the expected value comparison circuit 14.

In the expected value comparison circuit 14, a comparison is made between the test output signal 20 and the test expected value signal 21 and the comparison result signal 22 indicating the result of the comparison between the two signals is outputted to the BIST control circuit 12. From the BIST control circuit 12, the BIST result 6 indicating whether or not a product judged based on the comparison result signal 22 is acceptable is outputted to the LSI testing apparatus 1.

Thus, with the semiconductor integrated circuit according to Embodiment 7, it is possible to retrieve a plurality of HIGH-level or LOW-level signals required for a BIST test individually and directly from the ground terminal or the power source terminal in synchronization with the CLK signal without passing the signals through the external terminals of an LSI and reduce the number of the dedicated/shared test terminals provided outside the LSI.

In addition, since the semiconductor integrated circuit according to Embodiment 7 allows the generation of the complicated test expected values and test input values, a test can be performed without having some of the test input values in an internal circuit so that the effect of reducing a circuit area is obtained.

In Embodiment 7, components having the same structures as those of the test expected value programming circuit according to Embodiment 5 described above and those of the test input value programming circuit according to Embodiment 6 described above are used to compose the portion for retrieving the input values from the ground terminal and the power source terminal. However, the present invention is not particularly limited to the embodiment. Instead, it is also possible to use components having the same structures as those of the test expected value programming circuits according to Embodiments 1 to 4 described above and those of the test input value programming circuit.

Embodiment 8

Figure 15:
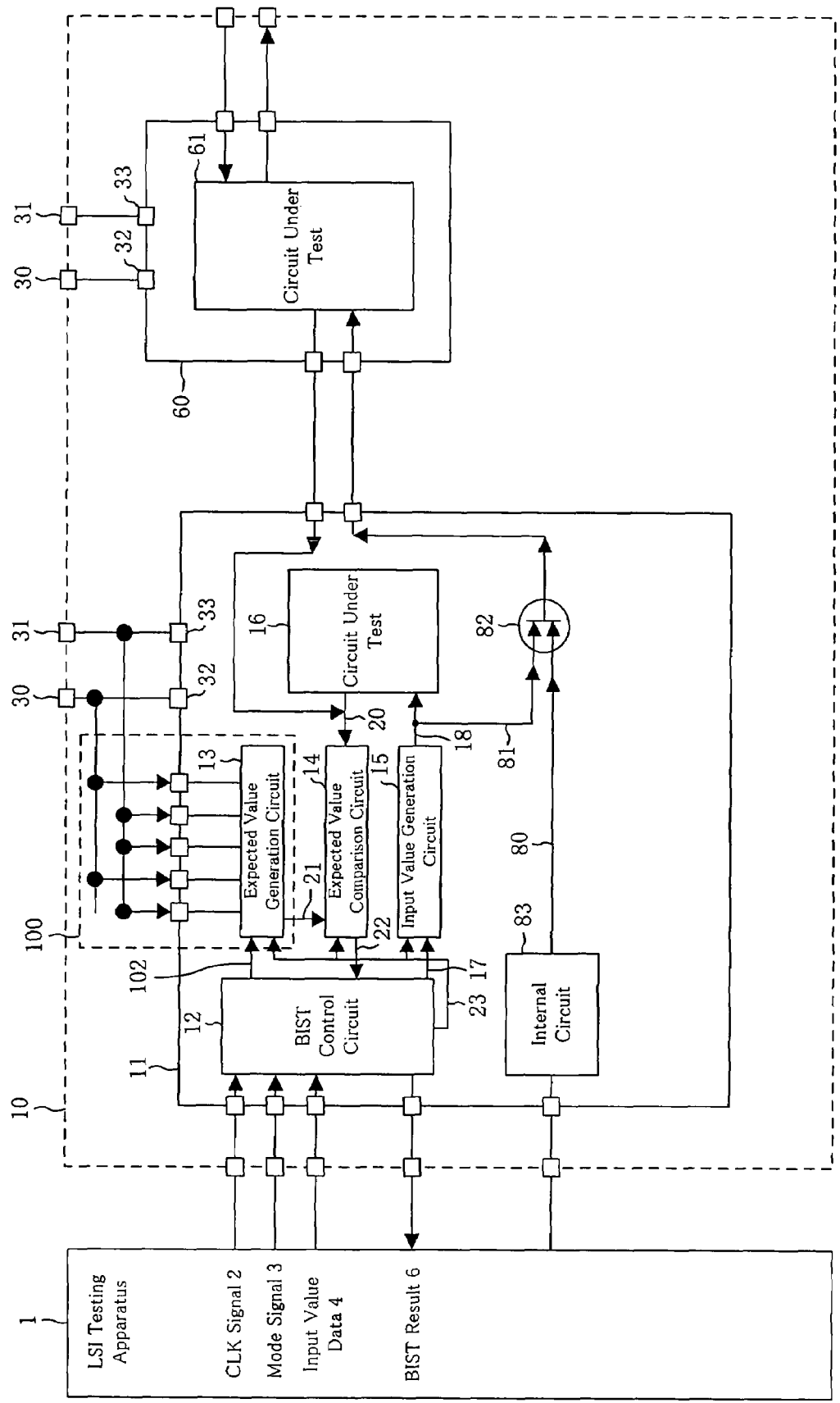
FIG. 15 is a block diagram showing a structure of a semiconductor integrated circuit in Embodiment 8 of the present invention.

FIG. 15 is a block diagram showing a structure of a semiconductor integrated circuit according to Embodiment 8 of the present invention. Embodiment 8 is different from Embodiment 5 described above in that two semiconductor integrated circuits are embedded in the single semiconductor integrated circuit package. Accordingly, a description will be given only to the difference by using the same reference numerals for the same components as in Embodiment 5.

As shown in FIG. 15, a semiconductor integrated circuit A11 and a semiconductor integrated circuit B60 are embedded in the semiconductor integrated circuit package 10. It is assumed herein that the semiconductor integrated circuit A11 is a circuit having a self-diagnostic function and the semiconductor integrated circuit B60 is a circuit not having a self-diagnostic function.

The semiconductor integrated circuit A11 comprises a selector 82 for selecting between signals inputted thereto and outputting the selected signal and an internal circuit 83 for receiving an input from the external terminal connected to the LSI testing apparatus 1, in addition to the components described above in, e.g., Embodiment 5.

To the selector 82, a first input signal 80 is inputted from the external terminal via the internal circuit 83 and the test input signal 18 outputted from the input value generation circuit 15 is also inputted as a second input signal 81.

The semiconductor integrated circuit A11 and the semiconductor integrated circuit B60 are connected such that the output from the selector 82 is inputted to the semiconductor integrated circuit B60 and that an output result in a circuit under test 61 within the semiconductor integrated circuit B60 is inputted to the expected value comparison circuit 14 of the semiconductor integrated circuit A11.

At any time other than during self-diagnosis, the first input signal 80 inputted to the selector 82 is outputted from the selector 82 and inputted to the semiconductor integrated circuit B60. However, since the first input signal 80 passes through the internal circuit 83, it is difficult to input an external input which allows direct testing of the semiconductor integrated circuit B60.

When self-diagnosis is performed, the second input signal 81 inputted to the selector 82 is outputted from the selector 82 and inputted to the semiconductor integrated circuit B60. The second input signal 81 is an input signal for testing the circuit under test 61 of the semiconductor integrated circuit B60. In the circuit under test 61, an output result responding to the second input signal 81 is generated and inputted as the test output signal 20 to the expected value comparison circuit 14 of the semiconductor integrated circuit A11. The subsequent operation is the same as in Embodiment 5 described above.

Thus, the semiconductor integrated circuit 8 according to Embodiment 8 is provided with the selector for selecting between the external input and the input during the self-diagnosis and outputting the selected input to the semiconductor integrated circuit having a self-diagnostic function. As a result, a test on the semiconductor integrated circuit not having a self-diagnostic function can be easily performed. This offers an advantage in solving the problem that, when a plurality of semiconductor integrated circuits are embedded in a single semiconductor integrated circuit package, it is conventionally necessary to provide dedicated/shared test terminals outside an LSI since it is difficult to test the semiconductor integrated circuit not having a self-diagnostic function.

In addition, it is possible to retrieve a plurality of HIGH-level or LOW-level signals required for a BIST test individually and directly from the ground terminals or the power source terminals in synchronization with the CLK signal without passing the signals through the external terminals of the LSI and reduce the number of the dedicated/shared test terminals provided outside the LSI.

Since a test need not be performed from the external terminals, the test can be performed with a path and at a speed actually used by a user. This offers an advantage in solving the problem that, when a circuit under test is to be functionally tested at the same speed as during the actual operation thereof in view of the recent increase in the speed of an LSI circuit, it is difficult to implement physical timing design for allowing a functional test to be performed on the entire LSI including the dedicated/shared test terminals and the circuit under test in actual operation.

Since the expected values for the test are externally generated and inputted, it is no more necessary to have the expected values within the circuit. As a result, a test can be performed without involving a hardware correction. This offers an advantage in solving the problem that, when a supply related problem occurs in a semiconductor integrated circuit to be constructed and another semiconductor integrated circuit is used as a substitute, a need occurs to change the expected values for the test and the test cannot be performed unless a hardware correction of the semiconductor integrated circuit is performed.

Although the semiconductor integrated circuit according to Embodiment 8 has used the structure according to Embodiment 5 described above which comprises only the test expected value programming circuit, the present invention is not particularly limited to the embodiment. For example, it is also possible to use, e.g., the structure which comprises the test input value programming circuit shown in Embodiment 4 or 6.

Embodiment 9

Figure 16:
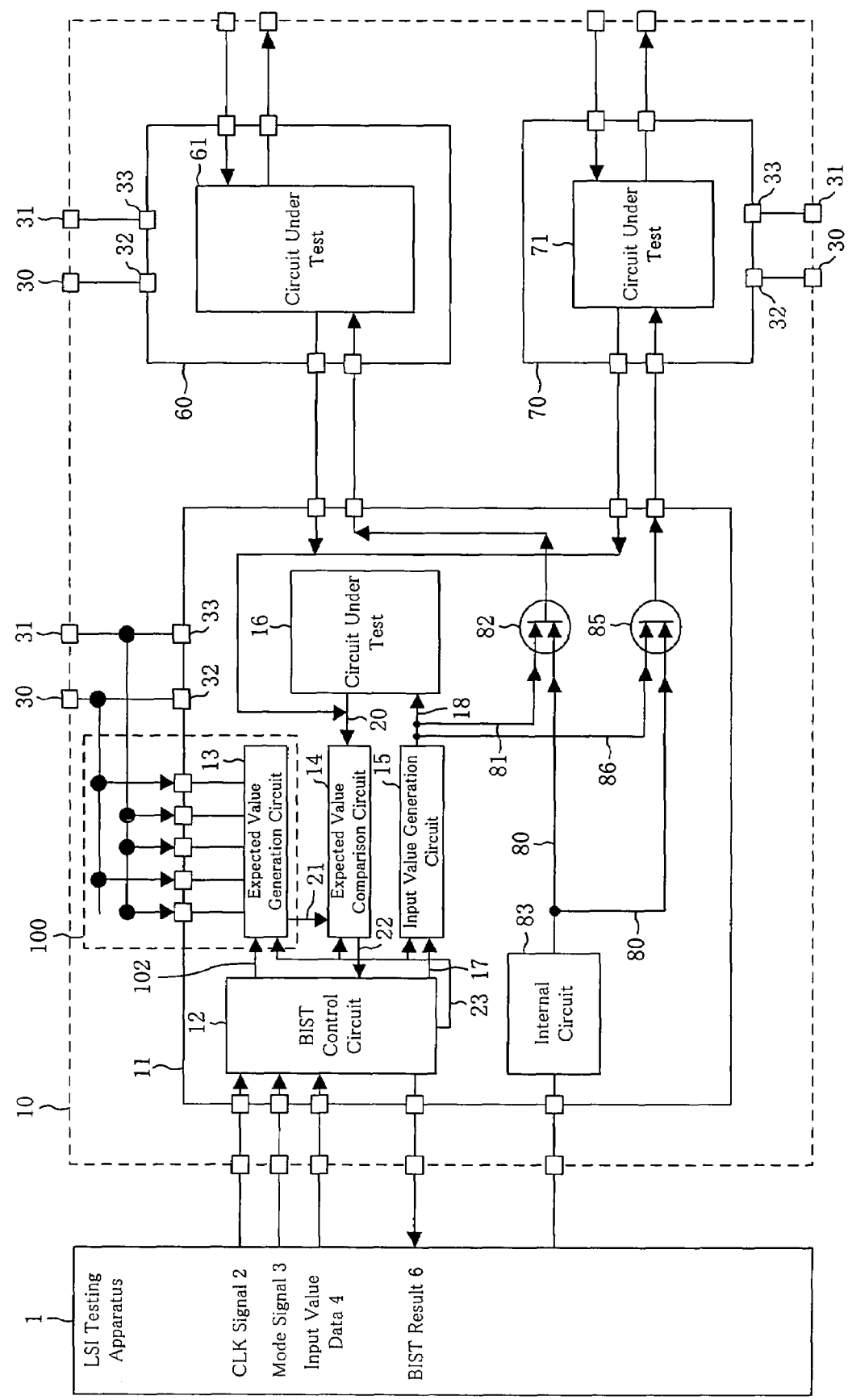
FIG. 16 is a block diagram showing a structure of a semiconductor integrated circuit in Embodiment 9 of the present invention.

FIG. 16 is a block diagram showing a structure of a semiconductor integrated circuit according to Embodiment 9 of the present invention. Embodiment 9 is different from Embodiment 8 described above in that N semiconductor integrated circuits are embedded in the single semiconductor integrated circuit package. Accordingly, a description will be given only to the difference by using the same reference numerals for the same components as in Embodiment 8.

As shown in FIG. 16, the semiconductor integrated circuit A11, the semiconductor integrated circuit B60, and a semiconductor integrated circuit N70 are embedded in the semiconductor integrated circuit package 10. It is assumed herein that only the semiconductor integrated circuit A11 is a circuit having a self-diagnostic function and each of the semiconductor integrated circuit B60 and the semiconductor integrated circuit N70 is a circuit not having a self-diagnostic function. It is also assumed that the semiconductor integrated circuit B60 and the semiconductor integrated circuit N70 are constructed not to be connected directly to each other.

It is assumed that N semiconductor integrated circuits are embedded in the semiconductor integrated circuit package 10, though they are not depicted.

The semiconductor integrated circuit A11 comprises a selector N85 in addition to the components described above in, e.g., Embodiment 8. To the selector N85, the first input signal 80 is inputted from the external terminal through the internal circuit 83 and the test input signal 18 outputted from the input value generation circuit 15 is inputted as a third input signal 86.

The semiconductor integrated circuit A11 and the semiconductor integrated circuit N70 are connected such that the output from the selector N85 is inputted to the semiconductor integrated circuit N70 and that an output result in a circuit under test 71 within the semiconductor integrated circuit N70 is inputted as the test output signal 20 to the expected value comparison circuit 14 of the semiconductor integrated circuit A11.

At any time other than during self-diagnosis, the respective first input signals 80 inputted to the selectors 82 and N85 are outputted from the selectors 82 and N85 and inputted to the semiconductor integrated circuits B60 and N70. However, since the first input signals 80 pass through the internal circuit 83, it is difficult to input an external input which allows direct testing of the semiconductor integrated circuits B60 and N70.

When self-diagnosis is performed, the second input signal 81 inputted to the selector 82 is outputted therefrom and inputted to the semiconductor integrated circuit B60 and the third input signal 86 inputted to the selector N85 is outputted therefrom and inputted to the semiconductor integrated circuit N70.

The second input signal 81 is an input signal for testing the semiconductor integrated circuit B60 and the third input signal 86 is an input signal for testing the circuit under test 71 of the semiconductor integrated circuit N70. In the circuit under test 61, an output result responding to the second input signal 81 is generated. In the circuit under test 71, an output result responding to the third input signal 86 is generated. Each of the output results is inputted as the test output signal 20 to the expected value comparison circuit 14 of the semiconductor integrated circuit A11. The subsequent operation is the same as in Embodiment 5 described above.

Thus, with the semiconductor integrated circuit according to Embodiment 9, a test can be easily performed when the plurality of semiconductor integrated circuits, each not having a self-diagnostic function, are present therein and the semiconductor integrated circuits each not having a self-diagnostic function are constructed not to be connected to each other. The other effects are the same as in Embodiment 8.

Embodiment 10

Figure 17:
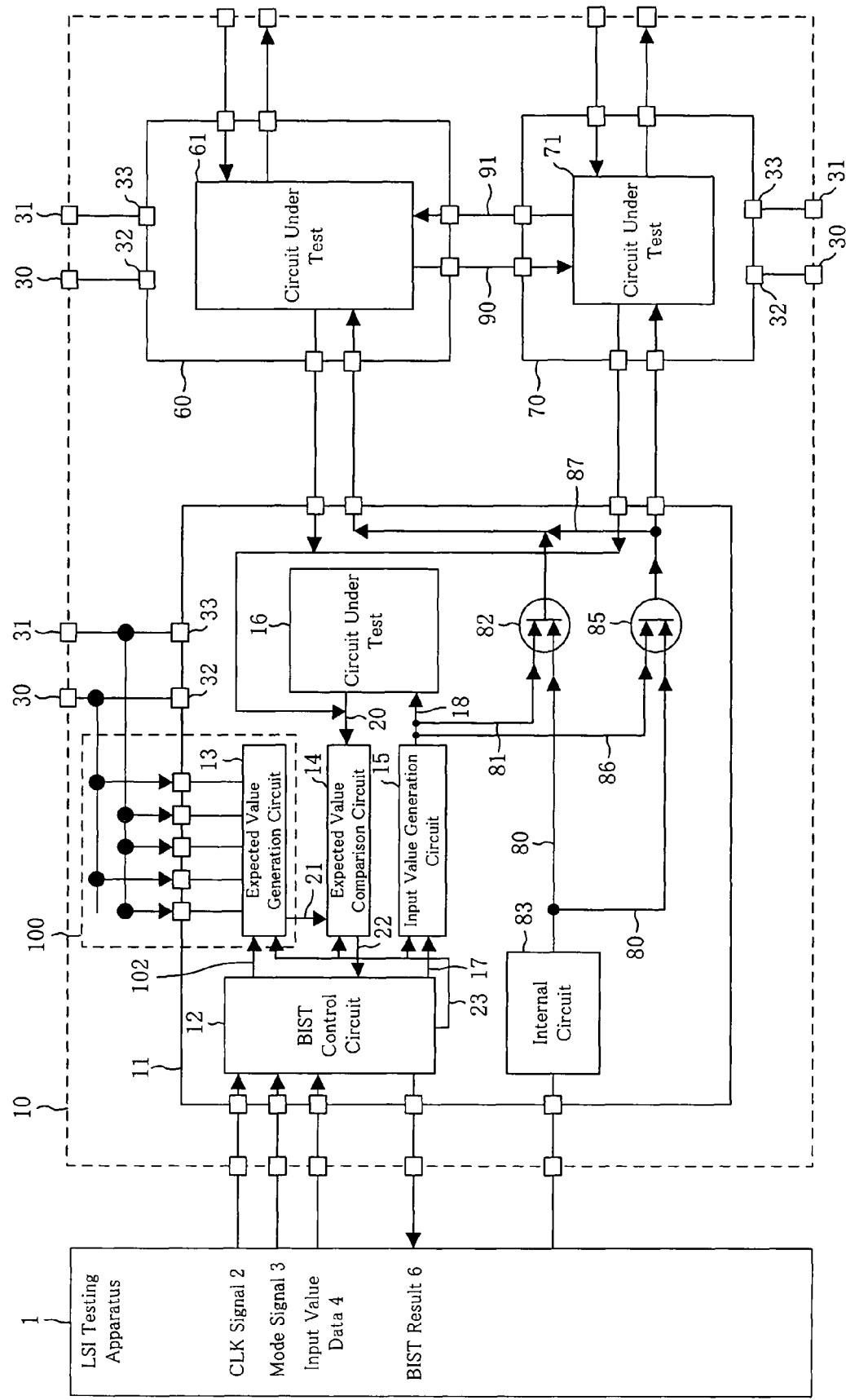
FIG. 17 is a block diagram showing a structure of a semiconductor integrated circuit in Embodiment 10 of the present invention.

FIG. 17 is a block diagram showing a structure of a semiconductor integrated circuit in Embodiment 10 of the present invention. Embodiment 10 is different from Embodiment 9 described above in that the semiconductor integrated circuits B and N, each not having a self-diagnostic function, are connected to each other. Accordingly, a description will be given only to the difference by using the same reference numerals for the same components as in Embodiment 9.

As shown in FIG. 17, the semiconductor integrated circuit A11, the semiconductor integrated circuit B60, and the semiconductor integrated circuit N70 are embedded in the semiconductor integrated circuit package 10. It is assumed herein that only the semiconductor integrated circuit A11 is a circuit having a self-diagnostic function and each of the semiconductor integrated circuit B60 and the semiconductor integrated circuit N70 is a circuit not having a self-diagnostic function. It is also assumed that the semiconductor integrated circuit B60 and the semiconductor integrated circuit N70 are connected directly to each other to be capable of exchanging a signal therebetween.

It is assumed that N semiconductor integrated circuits are embedded in the semiconductor integrated circuit package 10, though they are not depicted.

At any time other than during self-diagnosis, the respective first input signals 80 inputted to the selectors 82 and N85 are outputted from the selectors 82 and N85 and inputted to the semiconductor integrated circuits B60 and N70. However, since the first input signals 80 pass through the internal circuit 83, it is difficult to input an external input which allows direct testing of the semiconductor integrated circuits B60 and N70.

When self-diagnosis is performed, the second input signal 81 inputted to the selector 82 and the third input signal 86 inputted to the selector N85 are outputted therefrom. To the semiconductor integrated circuit B60, the second input signal 81 outputted from the selector 82 is inputted and the third input signal 86 outputted from the selector N85 is inputted as a fourth input signal 87. To the semiconductor integrated circuit N70, the third input signal 86 outputted from the selector N70 is inputted.

Then, by using a path connected in a state used by a user, a normal-time input signal 90 is inputted from the circuit under test 61 of the semiconductor integrated circuit B60 to the circuit under test 71 of the semiconductor integrated circuit N70. In the circuit under test 71, an output result responding to the normal-time input signal 90 is generated and outputted as a normal-time output signal 91 to the circuit under test 61. The output result from the circuit under test 71 passes through the semiconductor integrated circuit B60 and is inputted as the test output signal 20 to the expected value comparison circuit 14 of the semiconductor integrated circuit A11. The subsequent operation is the same as in Embodiment 5 described above.

Thus, with the semiconductor integrated circuit according to Embodiment 10, a test can be easily performed when the plurality of semiconductor integrated circuits, each not having a self-diagnostic function, are present therein and the semiconductor integrated circuits each not having a self-diagnostic function are constructed to be connected to each other. The other effects are the same as in Embodiment 8.

Embodiment 11

Figure 18:
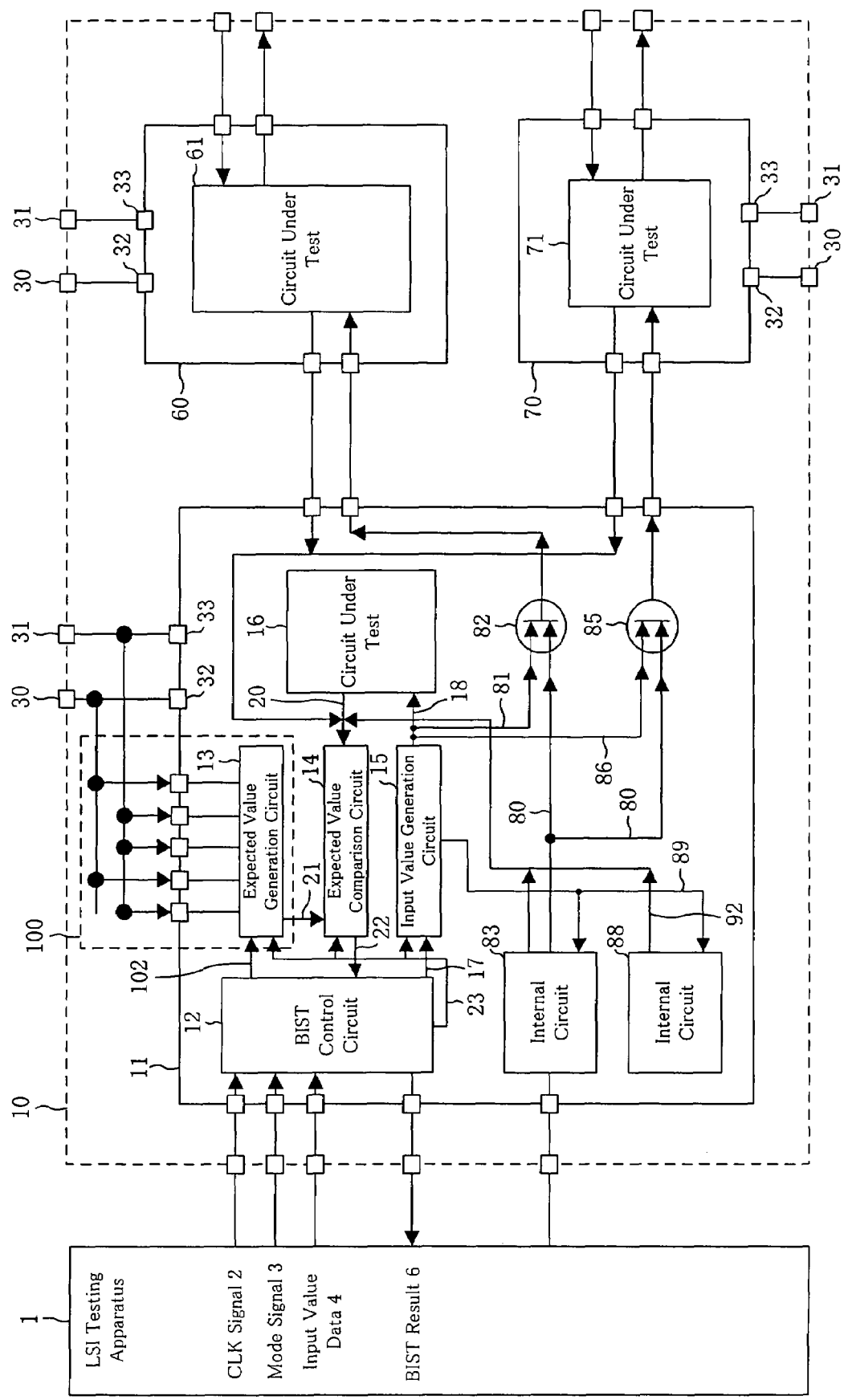
FIG. 18 is a block diagram showing a structure of a semiconductor integrated circuit in Embodiment 11 of the present invention.

FIG. 18 is a block diagram showing a structure of a semiconductor integrated circuit in Embodiment 11 of the present invention. Embodiment 11 is different from Embodiment 9 described above in that internal circuits for outputting burn-in output signals is provided. Accordingly, a description will be given only to the difference by using the same reference numerals for the same components as in Embodiment 9.

As shown in FIG. 18, the semiconductor integrated circuit A11, the semiconductor integrated circuit B60, and the semiconductor integrated circuit N70 are embedded in the semiconductor integrated circuit package 10. It is assumed herein that only the semiconductor integrated circuit A11 is a circuit having a self-diagnostic function and each of the semiconductor integrated circuit B60 and the semiconductor integrated circuit N70 is a circuit not having a self-diagnostic function. It is also assumed that the semiconductor integrated circuit B60 and the semiconductor integrated circuit N70 are constructed not to be connected directly to each other.

It is assumed that N semiconductor integrated circuits are embedded in the semiconductor integrated circuit package 10, though they are not depicted.

The semiconductor integrated circuit A11 comprises an internal circuit 88 in addition to the components described above in Embodiment 9. In the semiconductor integrated circuit A11 thus constructed, when a burn-in mode is selected, fifth input signals 89 for performing a burn-in operation to each of the internal circuits 83 and 88 are outputted from the input value generation circuit 15.

Then, respective burn-in output signals 92 are outputted from the internal circuits 83 and 88 in response to the fifth input signal 89 and inputted to the expected value comparison circuit 14. The operation of the self-diagnostic function is the same as in Embodiment 9 described above so that the description thereof is omitted.

The burn-in operations to these internal circuits 83 and 88 and the self-diagnostic function are processed in parallel to each other. In the expected value comparison circuit 14, a comparison is made between the result of the burn-in operation and the result of the self-diagnostic operation and a result of the comparison is outputted as the comparison result signal 22. The subsequent operation is the same as in Embodiment 9.

As described above, in a semiconductor integrated circuit package in which a plurality of semiconductor integrated circuits are embedded, it is difficult to perform the burn-in operation in the semiconductor integrated circuit not having a self-diagnostic function. However, with the semiconductor integrated circuit according to Embodiment 11, it is possible to easily implement toggling operations in all the semiconductor integrated circuits by simultaneously performing the burn-in operation in the semiconductor integrated circuit having a self-diagnostic function and the self-diagnostic operations in the other semiconductor integrated circuits and easily monitor the operation during the burn-in operation.

In addition, by retrieving a signal required for a burn-in operation directly from the ground terminal or the power source terminal without passing the signal through the external terminals of an LSI, the number of the dedicated/shared test burn-in terminals provided outside the LSI can be reduced.

Furthermore, since Embodiment 11 can cause simultaneous toggling operations in all the semiconductor integrated circuits, it is advantageous in reducing a burn-in time.

Embodiment 12

Figure 19:
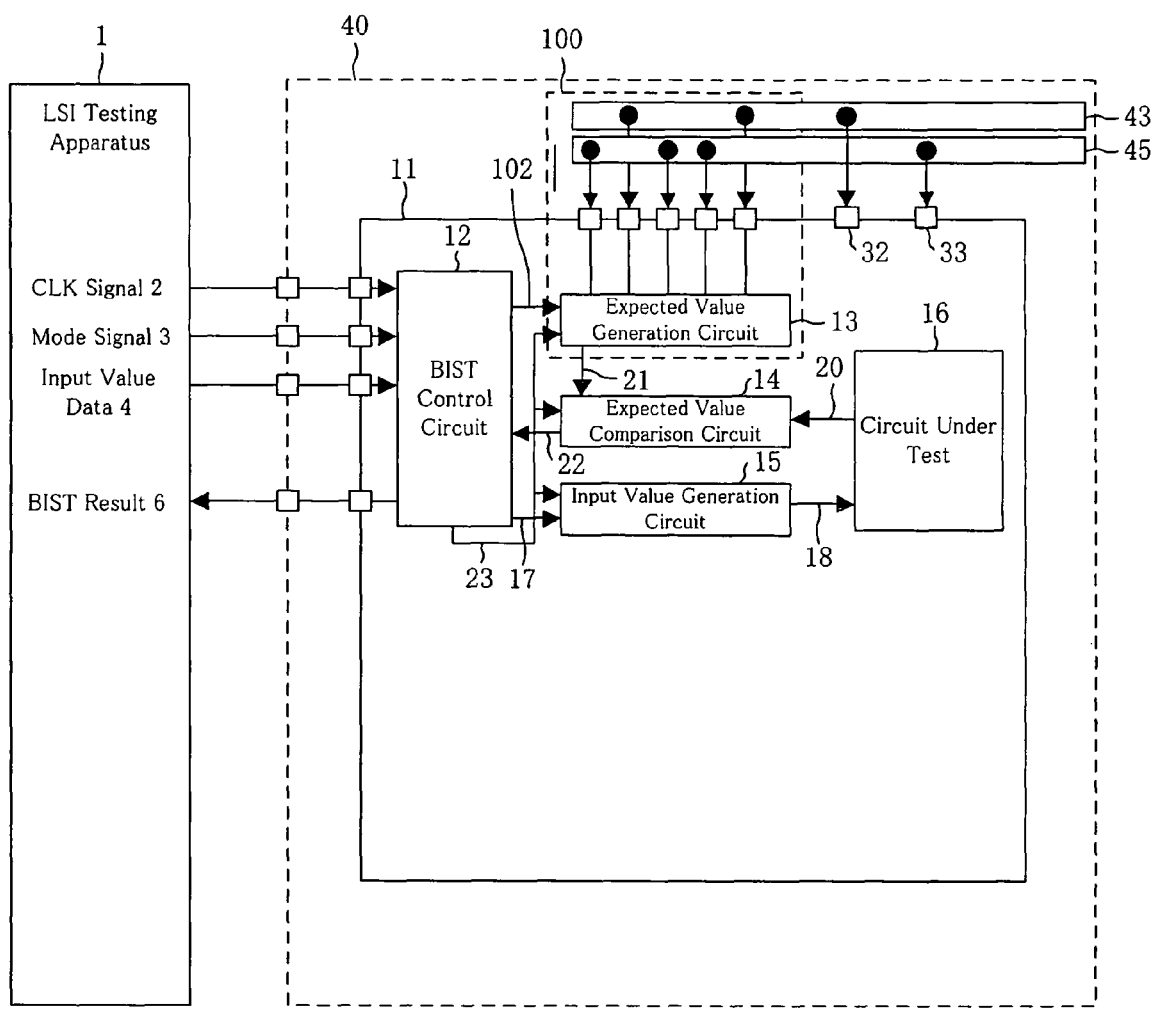
FIG. 19 is a block diagram showing a structure of a semiconductor integrated circuit in Embodiment 12 of the present invention.

FIG. 19 is a block diagram showing a structure of a semiconductor integrated circuit in Embodiment 12 of the present invention. Because Embodiment 12 has the same basic structure as Embodiment 5 described above, a description will be given only to the difference by using the same reference numerals for the same components as in Embodiment 5.

Figure 20:
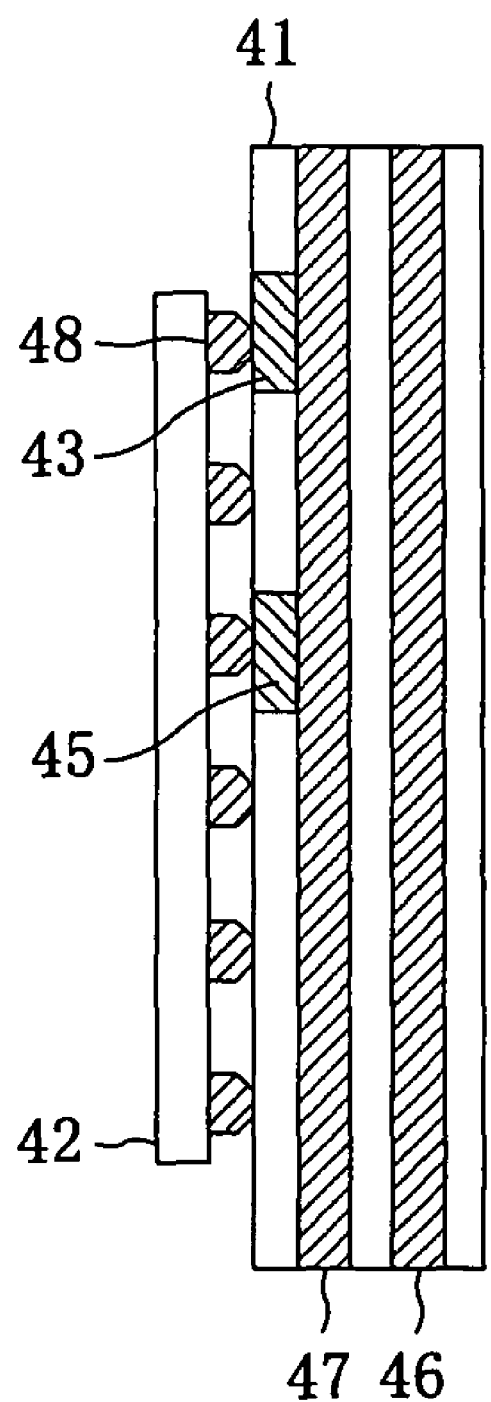
FIG. 20 is a cross-sectional view showing the structure of the semiconductor integrated circuit in Embodiment 12.

As shown in FIG. 19, the semiconductor integrated circuit A11 is embedded in a semiconductor integrated circuit board 40. As shown in FIG. 20, the semiconductor integrated circuit board 40 comprises a power source layer 46 and a ground layer 47 in the board composed of a plurality of layers. A power source land 45 and a ground land 43 are formed on the surface of the semiconductor integrated circuit board 40 connected to the semiconductor integrated circuit A. By connecting a power source pad 33 to the power source land 45 and connecting a ground pad 32 to the ground land 43, the semiconductor integrated circuit A and the semiconductor integrated circuit board 40 are electrically connected.

In the test expected value programming circuit 100, the test expected values can be generated by selectively connecting the input/input-output pad 103 to the power source land 45 or to the ground land 43 during assembly. The subsequent operation is the same as in Embodiment 5.

Thus, with the semiconductor integrated circuit according to Embodiment 12, it is possible to easily implement a functional test on the circuit under test 16 by using the existing power source land 45 or the ground land 43 in a package such as, e.g., a chip-size package (hereinafter referred to as CSP). The other effects are the same as in Embodiment 5.

Although Embodiment 12 has described the case where the semiconductor integrated circuit is composed of the single semiconductor integrated circuit of CSP, the present invention is not limited to the embodiment. When the semiconductor integrated circuit is composed of a plurality of semiconductor integrated circuits, even a package constructed by using a semiconductor integrated circuit board such as, e.g., a multi-chip module (hereinafter referred to as MCM) can implement the present invention.

Embodiment 13

Figure 21:
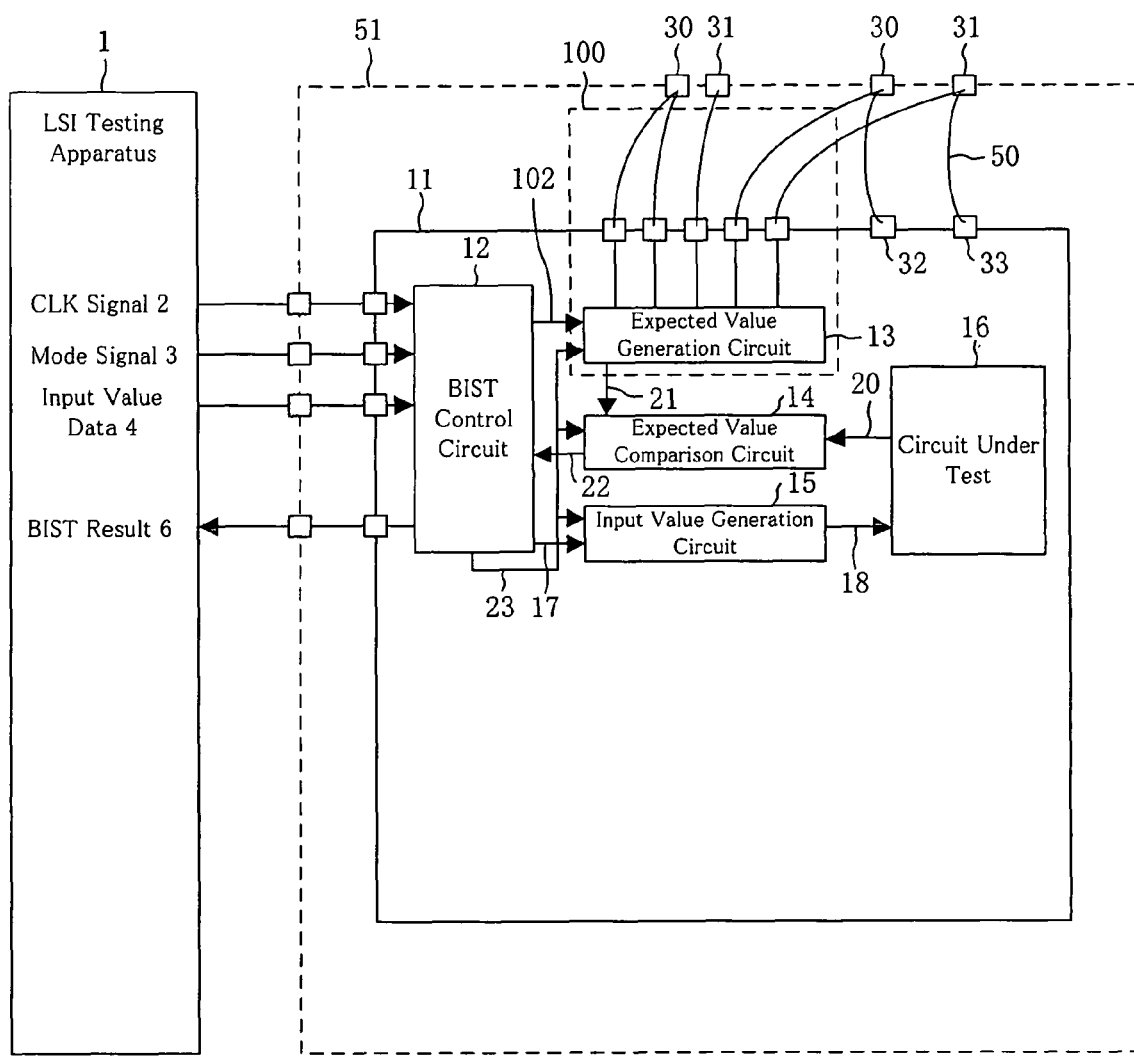
FIG. 21 is a block diagram showing a structure of a semiconductor integrated circuit in Embodiment 13 of the present invention.

FIG. 21 is a block diagram showing a structure of a semiconductor integrated circuit in Embodiment 13 of the present invention. Embodiment 13 is different from Embodiment 5 described above in that the connections between the ground terminals or the power source terminals and the input/input-output pad are provided by using wire lines.

Accordingly, a description will be given only to the difference by using the same reference numerals for the same components as in Embodiment 5.

Figure 22:
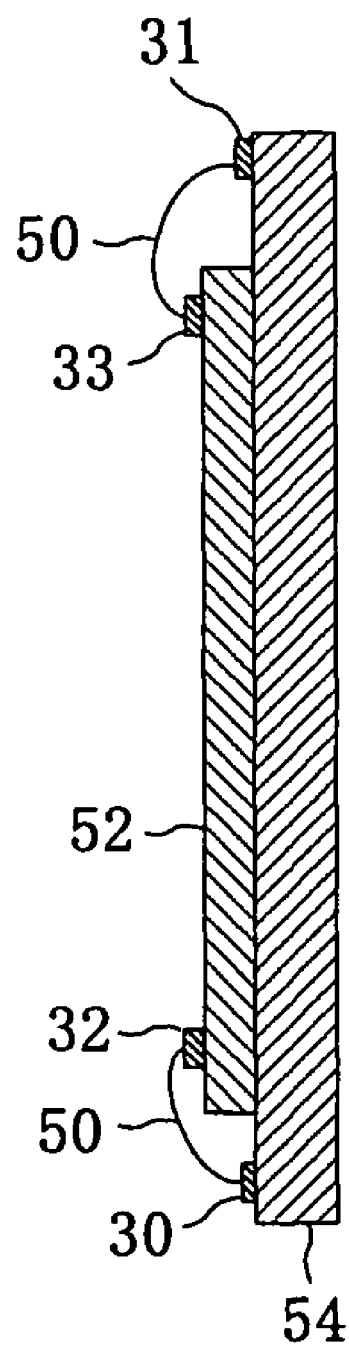
FIG. 22 is a cross-sectional view showing the structure of the semiconductor integrated circuit in Embodiment 13.

As shown in FIG. 21, a semiconductor integrated circuit package 51 is composed of the semiconductor integrated circuit A11 and a lead frame 54 (see FIG. 22) which are connected via wire lines 50. Specifically, the connection between the power source terminal 31 and the power source pad 33 and the connection between the ground terminal 30 and the ground pad 32 are provided via the respective inner leads of the lead frame 54.

In the test expected value programming circuit 100, the test expected values can be generated by selectively connecting the input/input-output pad 103 to the power source terminal 31 or to the ground terminal 30 during assembly. The subsequent operation is the same as in Embodiment 5.

Thus, with the semiconductor integrated circuit according to Embodiment 13, it is possible to easily perform a functional test on the circuit under test 16 by routing the wire lines 50 from the existing power source terminals 31 or the ground terminals 30 in a package such as, e.g., a quad flat package (hereinafter referred to as QFP). The other effects are the same as in Embodiment 5.

Although Embodiment 13 has described the case where the semiconductor integrated circuit is composed of the single semiconductor integrated circuit of QFP, the present invention is not limited to the embodiment. When the semiconductor integrated circuit is composed of a plurality of semiconductor integrated circuits, the semiconductor integrated circuit can be implemented even with a package of a type constructed by, e.g., bonding individual semiconductor integrated circuits to each other using wire lines.

Although the semiconductor integrated circuits A according to Embodiments 1 to 13 have been described by using the semiconductor integrated circuits each having a self-diagnostic function, even a semiconductor integrated circuit not having a self-diagnostic function can implement the present invention.

INDUSTRIAL APPLICABILITY

Since a semiconductor integrated circuit according to the present invention can achieve the highly practical effects of allowing a reduction in the number of terminals required for a functional test by using a power source terminal and a ground terminal and allowing an easy test to be performed without using a costly LSI testing apparatus, it is extremely useful and high in industrial applicability.

The semiconductor integrated circuit according to the present invention can also be used to test a set after mounting used by a user.

What is claimed is:

1. A semiconductor integrated circuit having an embedded circuit under test to be tested, the semiconductor integrated circuit comprising:
test expected value programming means for generating a test expected value signal for a comparison with a test result in the circuit under test, wherein
the test expected value programming means comprises:
an input/input-output pad for retrieving a predetermined input signal required for a test from a ground terminal or a power source terminal connected to the semiconductor integrated circuit;
a switch connected to the input/input-output pad to selectively switch an output state of the signal inputted via the input/input-output pad; and
an expected value generation circuit for generating the test expected value signal based on an output signal outputted from the switch.

2. The semiconductor integrated circuit of claim 1, wherein the test expected value programming means further comprises:
output inverting means for inverting the input signal and outputting the inverted input signal.

3. The semiconductor integrated circuit of claim 2, wherein the test expected value programming means further comprises:
signal dividing means for dividing the output signal outputted from the switch into a plurality of signals.

4. The semiconductor integrated circuit of claim 2, wherein the test expected value programming means comprises a plurality of the input/input-output pads and a plurality of the switches connected to the input/input-output pads and further comprises:
a switch control circuit for simultaneously controlling respective switching operations of the plurality of switches.

5. The semiconductor integrated circuit of claim 2, wherein the test expected value programming means comprises a plurality of the input/input-output pads and a plurality of the switches connected to the input/input-output pads and further comprises:
a switch control circuit for individually controlling respective switching operations of the plurality of switches.

6. A semiconductor integrated circuit comprising:
the test expected value programming means in the semiconductor integrated circuit of claim 1; and
test input value programming means for generating a test input signal for performing a test on a circuit under test, wherein
the test input value programming means comprises:
an input/input-output pad for retrieving a predetermined input signal required for the test from a ground terminal or a power source terminal connected to the semiconductor integrated circuit;
a switch connected to the input/input-output pad to selectively switch an output state of the signal inputted via the input/input-output pad; and
an input value generation circuit for generating the test input signal based on an output signal outputted from the switch.

7. A system LSI comprising:
a first semiconductor integrated circuit having a self-diagnostic function; and
a second semiconductor integrated circuit not having a self-diagnostic function, wherein
the first semiconductor integrated circuit comprises at least one of:
the test expected value programming means in the semiconductor integrated circuit of claim 1; and
test input value programming means having an input/input-output pad for retrieving a predetermined input signal required for a test from a ground terminal or a power source terminal connected to the semiconductor integrated circuit, a switch connected to the input/input-output pad to selectively switch an output state of the signal inputted via the input/input-output pad, and
an input value generation circuit for generating a test input signal for performing the test on a circuit under test based on an output signal outputted from the switch, and further comprises:
a selector for receiving each of a first input signal inputted from an external terminal of the first semiconductor integrated circuit and a second input signal outputted from the input value generation circuit for generating the test input signal, wherein
the selector is constructed to output the first input signal at any time other than during self-diagnosis, while outputting the second input signal during the self-diagnosis and inputting the outputted signal to the second semiconductor integrated circuit, wherein the second semiconductor integrated circuit is constructed to perform the test based on the output signal and output a test output signal indicating a result of the test to an expected value comparison circuit embedded in the first semiconductor integrated circuit.

8. The system LSI of claim 7, wherein the first semiconductor integrated circuit is constructed to perform a burn-in operation by inputting the second input signal outputted from the input value generation circuit to an internal circuit of the first semiconductor integrated circuit and inputting an output signal outputted from the internal circuit in response to the input to expected value comparing means of the first semiconductor integrated circuit.

9. A system LSI comprising:
a first semiconductor integrated circuit having a self-diagnostic function; and
second to N-th (N is a natural number) semiconductor integrated circuits each not having a self-diagnostic function, wherein
the first semiconductor integrated circuit comprises at least one of:
the test expected value programming means in the semiconductor integrated circuit of claim 1; and
test input value programming means having an input/input-output pad for retrieving a predetermined input signal required for a test from a ground terminal or a power source terminal connected to the semiconductor integrated circuit, a switch connected to the input/input-output pad to selectively switch an output state of the signal inputted via the input/input-output pad, and an input value generation circuit for generating a test input signal for performing the test on a circuit under test based on an output signal outputted from the switch, and further comprises:
a plurality of selectors for receiving respective first input signals each inputted from an external terminal of the first semiconductor integrated circuit and respective second input signals each outputted from the input value generation circuit for generating the test input signal, wherein
the plurality of selectors are constructed to output the first input signals at any time other than during self-diagnosis, while outputting the second input signals during the self-diagnosis and inputting the outputted signals to the corresponding second to N-th semiconductor integrated circuits, wherein the second to N-th semiconductor integrated circuits are constructed to perform the respective tests based on the output signals and output a plurality of test output signals indicating respective results of the tests to an expected value comparison circuit embedded in the first semiconductor integrated circuit.

10. The system LSI of claim 9, wherein the second to N-th semiconductor integrated circuits are electrically connected to each other and constructed to be capable of inputting and outputting signals required for the tests between the second to N-th semiconductor integrated circuits during the self diagnosis.

11. The system LSI of claim 9, wherein the first semiconductor integrated circuit is constructed to perform a burn-in operation by inputting the second input signal outputted from the input value generation circuit to an internal circuit of the first semiconductor integrated circuit and inputting an output signal outputted from the internal circuit in response to the input to expected value comparing means of the first semiconductor integrated circuit.

12. The semiconductor integrated circuit of claim 1, wherein a land allocated as the power source terminal or the ground terminal and the input/input-output pad are electrically connected via electric wiring in at least one layer of a package.

13. The semiconductor integrated circuit of claim 1, wherein an inner lead of a lead frame allocated as the power source terminal or the ground terminal and the input/input-output pad are electrically connected via a wire line.

14. A semiconductor integrated circuit having an embedded circuit under test to be tested the semiconductor integrated circuit comprising:
test input value programming means for generating a test input signal for performing a test on the circuit under test, wherein
the test input value programming means comprises:
an input/input-output pad for retrieving a predetermined input signal required for the test from a ground terminal or a power source terminal connected to the semiconductor integrated circuit;
a switch connected to the input/input-output pad to selectively switch an output state of the signal inputted via the input/input-output pad; and
an input value generation circuit for generating the test input signal based on an output signal outputted from the switch.

* * * * *